(12) United States Patent
Drndic et al.

(10) Patent No.: US 7,813,160 B2
(45) Date of Patent: Oct. 12, 2010

(54) NANOCRYSTAL QUANTUM DOT MEMORY DEVICES

(75) Inventors: Marija Drndic, Philadelphia, PA (US); Michael D. Fischbein, Philadelphia, PA (US)

(73) Assignee: The Trustees Of The University Of Pennsylvania, Philadelphia, PA (US)

( * ) Notice: Subject to any disclaimer, the term of this patent is extended or adjusted under 35 U.S.C. 154(b) by 724 days.

(21) Appl. No.: 11/329,471

(22) Filed: Jan. 11, 2006

(65) Prior Publication Data

US 2006/0221672 A1 Oct. 5, 2006

Related U.S. Application Data

(60) Provisional application No. 60/643,245, filed on Jan. 11, 2005.

(51) Int. Cl.
*G11C 11/00* (2006.01)
(52) U.S. Cl. .................. 365/151; 365/111; 977/943
(58) Field of Classification Search .......... 977/708, 977/712, 943; 365/111, 112, 151, 153
See application file for complete search history.

(56) References Cited

U.S. PATENT DOCUMENTS

| | | | |
|---|---|---|---|
| 6,322,901 B1 | 11/2001 | Bawendi et al. | 428/548 |
| 6,744,960 B2 * | 6/2004 | Pelka | 385/130 |
| 7,301,172 B2 * | 11/2007 | Atwater et al. | 257/79 |
| 2002/0163830 A1 | 11/2002 | Bulovic et al. | 365/151 |
| 2004/0043583 A1 | 3/2004 | Rao et al. | 438/503 |
| 2004/0256662 A1 | 12/2004 | Black et al. | 257/317 |
| 2005/0045867 A1 * | 3/2005 | Ozkan et al. | 257/12 |
| 2008/0017845 A1 * | 1/2008 | Drndic et al. | 257/24 |

FOREIGN PATENT DOCUMENTS

WO WO2004/078027 A3 9/2004

OTHER PUBLICATIONS

Hess et al., "Surface Transformation and Photoinduced Recovery in CdSe Nanocrystals," Physical Review Letters vol. 86 No. 14, pp. 3132-3135.*
Drndic, M., et al., "Transport properties of annealed CdSe colloidal nanocrystal solids," J. Appl. Phys., 2002, 92(12), 7498-7503.
Fischbein, M.D., et al., "CdSe nanocrystal quantum dot memory," Applied Physics Letts., 2005, 86, 193106-1-193106-3.
Ginger, D.S., et al., "Charge injection and transport in films of CdSe nanocrystals," J.Appl. Phys., 2000, 87(3), 1361-1368.

(Continued)

*Primary Examiner*—Van Thu Nguyen
*Assistant Examiner*—Alexander Sofocleous
(74) *Attorney, Agent, or Firm*—Woodcock Washburn, LLP

(57) ABSTRACT

Memory devices and recordable media are disclosed that take advantage of memory effects in the electronic transport in CdSe nanocrystal (NC) quantum dot arrays. Conduction through a NC array can be reduced with a negative voltage and then restored with a positive voltage. Light can also be used to restore or even increase the NC array conduction. The switching of the conduction in CdSe NC arrays and found the behavior to be highly sensitive to the value and duration of the laser and voltage pulses.

44 Claims, 23 Drawing Sheets

OTHER PUBLICATIONS

Greene, K., "Quantum hardware," 2005, http://www.technologyreview.com/InfoTech/wtr_16063,294,p2.html?PM-GO, downloaded from the internet on Dec. 19, 2005, 3 pages.

Huang, Q., et al., "Synthesis and characterization of CdS/multiwalled carbon nanotube heterojunctions," Nanotechnology, 15, 1855-1860.

Kalaugher, L., "Nanoparticles boost solar cells," 2005, http://www.nanotechweb.org/articles/news/4/10/13/1, downloaded from the internet on Oct. 25, 2005, 2 pages.

Klein, D.L., et al., "A single-electron transistor made from a cadmium selenide nanocrystal," Nature, 1997, 389, 699-701.

Lankhorst, M.H.R., et al., "Low-cost and nanoscale non-volatile memory concept for future silicon chips," Nature, 2005, 1-6.

Mattoussi, H., et al., "Electroluminescence from heterostructures of poly(phenylene vinylene) and inorganic CdSe nanocrystals," Journal of Applied Physics, 83(12), 7965-7974 (abstract).

Mattoussi, H., et al., "Composite thin films of CdSe nanocrystals and a surface passivating/electron transporting block copolymer: correlations between film microstructure by transmission electron microscopy and electroluminescence," Journal of Applied Physics, 1999, 86(8), 4390-4399 (abstract).

Morgan, N.Y., et al., "Electronic transport in films of colloidal CdSe nanocrystals," Phys. Rev. B, 2002, 66, 075339-1-075339-9.

Novikov, D.S., et al., "Anomalous transport in quantum dot arrays," Cond. Mat. Phys. (preprint), 2003, arXiv:cond-mat/0307031 v1, 1-5.

Romero, H.E., et al., "Transport phenomena in colloidal PbSe nanocrystal quantum-dot solids," Depart. Of Physics & Astronomy, University of Pennsylvania, 2005, 5 pages.

Schlamp, M.C., et al., "Improved efficiencies in light emitting diodes made with CdSe(CdS) core/shell type nanocrystals and a semiconducting polymer," J. of Applied Physics, 1997, 82(11), 5837-5842 (abstract).

Song, A.M., et al., "Nanometer-scale two-terminal semiconductor memory operating at room temperature," Applied Physics Letts, 2005, 86, 042106-042106-3.

Talapin, D.V., et al., "PbSe nanocrystal solids for n- and p-channel thin film field-effect transistors," Science Magazine, 2005, 86-89 (abstract).

Walters, R.J., et al., "Silicon optical nanocrystal memory," Applied Physics Letts, 2004, 85(13), 2622-2624.

Woo, W., et al., "Reversible charging of CdSe nanocrystals in a simple solid-state device," Adv. Mater., 2002, 14(15), 1068.

Yu, D., et al., "Variable range hopping conduction in semiconductor nanocrystal solids," Phys. Rev. Lett., 2004, 92(21), 216801-1-216802-4.

* cited by examiner

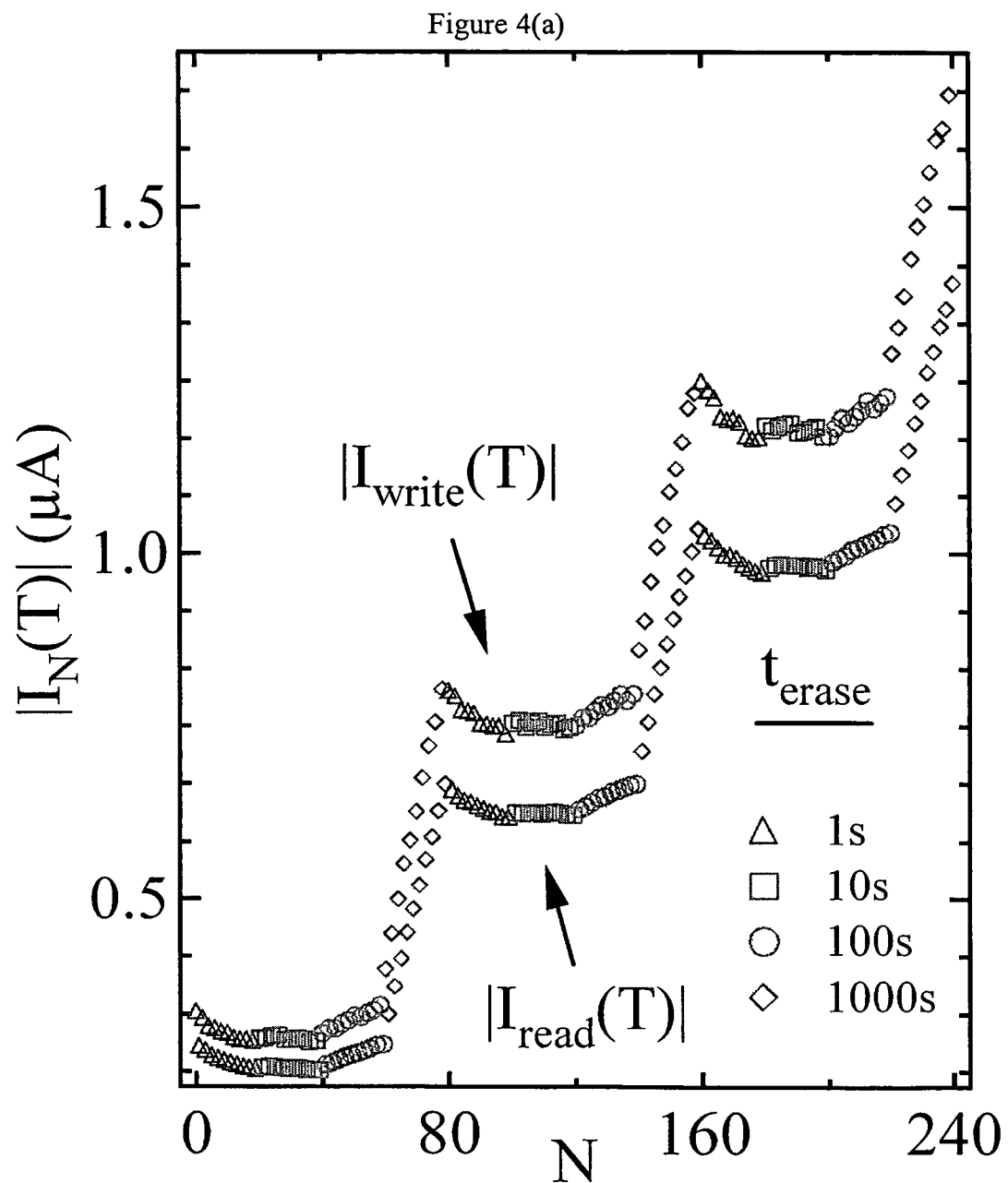

Self-assembly of *nanocrystal solids* can have $h_1 > h_2$ (e.g. NC monolayer)

NANOCRYSTAL QUANTUM DOT MEMORY DEVICES

CROSS-REFERENCE TO RELATED APPLICATIONS

This patent application claims benefit to U.S. Patent Application Ser. No. 60/643,245, filed Jan. 11, 2005, the entirety of which is incorporated by reference herein.

GOVERNMENT RIGHTS

The invention was made with U.S. Government support. The Government may have certain rights in the invention under Office of Naval Research Grant No. N000140410489 and NSF IGERT Program Grant No. DGE-0221664.

STATEMENT OF FIELD OF THE INVENTION

The present invention is generally related to the field of memory devices. The present invention is also generally related to the field of nonvolatile memory devices and methods for making same. The present invention is also related to the field of recordable mediums.

BACKGROUND OF THE INVENTION

Undoped semiconductor CdSe nanocrystal (NC) arrays have been found to be highly insulating (Ginger, D. S., et al., J. Appl. Phys. 87, p. 1361-1368, 2000; Morgan, N. Y., et al., Phys. Rev. B 66, 075339, 2002). Due to the nanometer size scale of the NCs, quantum confinement effects play a dominant role in their electronic properties. Individual CdSe NCs have discrete energy levels separated by 100 meV and charging energies ~150 meV (Morgan et al.). CdSe quantum dots capped with ~1-nm thick organic ligands act as tunnel barriers for charge transport between adjacent dots. Time-dependent transport phenomena, history effects and persistent photoconductivity in CdSe NC arrays have been observed (Ginger et al., Morgan et al., Woo, W., et al., Adv. Mater., 15, 1068, 2002; Drndic, M., et al., J. Appl. Phys. 92 (12), 7498, 2002). Proposed models to explain these effects include charge traps (Ginger, et al.,), the Coulomb glass [2,4] (Morgan, et al., and Drndic, et al.), and Levy statistics (Novikov, D. S., et al., Cond. Mat. Phys., preprint, 0307031, 2003).

U.S. Pat. App. Pub. No. 2004/0256662 to Black et al. pertains to nonvolatile memory device using semiconductor nanocrystals and method of forming same. U.S. Pat. App. Pub. No. 2004/0043583 to Rao, et al. pertains to a method of forming nanocrystals in a memory device. U.S. Pat. App. Pub. No. 2002/0163830 to Bulovic et al. pertains to molecular memory devices. Further improvements in memory devices and recordable media are needed.

SUMMARY OF THE INVENTION

The present invention provides recordable media, comprising an electrically conductive film composed of one or more nanocrystals, the electrically conductive film situated in electrical communication with a source electrode and a drain electrode.

The present invention also provides memory devices, comprising an electrically conductive film composed of one or more nanocrystals, the electrically conductive film situated in electrical communication with a source electrode and a drain electrode, and a voltage source for inducing and detecting a memory effect in said electrically conductive film.

In addition, the present invention further provides methods of operating a memory device, comprising applying a first voltage pulse to alter the electrical properties of an electrically conductive film composed of nanocrystals during a first time period, the electrically conductive film being in electrical contact with a source electrode and a drain electrode, applying a second voltage pulse to the electrically conductive film during a second time period, and correlating an electrical property of said electrically conductive film in response to the second voltage pulse to ascertain whether the electrically conductive film was altered by the first voltage pulse.

The present invention further provides compositions comprising a nanotube having an open end, and a semiconducting nanocrystal covalently bonded to said open end.

In addition, the present invention also provides electrical components comprising a nanotube having an open end, and a semiconducting nanocrystal covalently bonded to said open end, wherein the nanotube and nanocrystal are in electrical communication.

The present invention further provides methods of writing one or more data bits on a recordable media, comprising: applying a first voltage pulse to alter the electrical properties of an electrically conductive film composed of nanocrystals during a first time period, the electrically conductive film being in electrical contact with a source electrode and a drain electrode.

The present invention further provides methods of reading one or more data bits written on a recordable media in which a first voltage pulse was applied to alter the electrical properties of an electrically conductive film composed of nanocrystals during a first time period, the electrically conductive film being in electrical contact with a source electrode and a drain electrode, the method comprising: applying a second voltage pulse to the electrically conductive film during a second time period, and correlating an electrical property of said electrically conductive film in response to the second voltage pulse to ascertain whether the electrically conductive film was altered by the first voltage pulse.

The present invention also provides memory devices based on nanocrystalline materials and methods of operating such memory devices. Voltage pulses applied to CdSe nanocrystals provide a memory effect that can be used for preparing memory devices. In particular, for a sequence of two negative voltage pulses, the nanocrystals' response to the second pulse depends on the value and duration of the first pulse. The first voltage pulse functions as a "write" step and the second voltage pulse functions as a "read" step. The nanocrystals are capable of write-read-erase programmability. A range of different write steps can be performed and the current transients generated by the read steps can be characterized as a function of the waiting time between the two pulses. The effect of the write steps can be undone (i.e., "erased") by either shining band gap light on the nanocrystals or by applying a positive voltage bias; such events provide "erase" steps. Full write-read-erase cycles are exemplified and demonstrate that nanocrystals can be used to fashion memory devices and recordable media.

The present invention also provides nanocrystal-based electronic devices that can be used for electronic memory and data storage applications. Suitable nanocrystals are colloidal, i.e., they are chemically synthesized and can be deposited as arrays or films on insulating substrates, such as silicon oxide substrates, between small, lithographically patterned, electrodes. The current-voltage ("CV") characteristics of the nanocrystal arrays show hysteresis, which can be exploited to create an electronic memory device, recordable media, or both. When negative voltage is applied to the devices, information can be stored. Information can be deleted or erased with positive voltage pulses applied to the nanocrystal-based devices or with light when the devices are illuminated. The wavelength of the light is suitably chosen such that the light energy is greater than the bandgap of the nanocrystals. For example, memory devices and recordable media have been exemplified using CdSe and CdSe/ZnS nanocrystals capped with tri-octylphosphine oxide ("TOPO") and pyridine. The devices operate at room temperature, above room temperature, and at high temperatures, as well as at low temperatures (such as 77 K). A protective insulator layer (e.g., silicon oxide, polyimide, silicon nitride or other insulators) can be placed on top of the nanocrystal layer to help prevent nanocrystal layer degradation in air.

Other technical details, the relevant data and explanations pertaining to implementation of the various aspects of the invention are provided herein below. Write, read and erase voltage steps are provided. One exemplary nanocrystal memory device, described herein below, has been tested in operation over a period of about three months.

Exemplary memory devices have been built and tested for their performance in memory applications. Their electrical characteristics (i.e., the nature of their electrical response to voltages and light) have been measured. Source and drain electrodes are typically used for voltage applications. In certain embodiments, the memory devices are composed of field-effect transistor geometries. Voltages can be applied to a third electrode (i.e., the "gate" electrode) and the memory characteristics of these devices can be operated by controlling gate voltage. Memory devices can also be prepared using mixtures of nanocrystals of at least two different sizes. For instance, certain embodiments of the present invention include devices composed of 'red' and 'blue' nanocrystals. Using green light for excitation, memory devices and recordable media can be selectively erased, i.e., the red nanocrystals can be selectively erased without affecting the blue nanocrystals.

The present invention also provides 'sandwich-like' electrode geometries, where a nanocrystal array or film is sandwiched between bottom and top electrodes. Exemplary devices tested include a planar FET geometry which is capable of providing a three-terminal device, i.e., having a source, drain and a gate.

The present invention also provides for nanocrystals memory elements that can be integrated as components of electronic devices. Because they are small, they can be used in high-density data storage.

Other aspects of the present invention will be apparent to those skilled in the art in view of the detailed description and drawings of the invention as provided herein.

BRIEF DESCRIPTION OF THE DRAWINGS

The foregoing summary, as well as the following detailed description, is further understood when read in conjunction with the appended drawings. For the purpose of illustrating the invention, there is shown in the drawings exemplary embodiments of the invention; however, the invention is not limited to the specific methods, compositions, and devices disclosed. In the drawings:

FIG. 3(b2) depicts voltage versus time for one modified memory cycle (N=0 to 9);

FIG. 12(a) illustrates a schematic diagram of an embodiment of a recordable media of the present invention that includes three NC layers, each NC layer of a different NC size;

FIG. 12(b) illustrates a schematic diagram of an embodiment of a recordable media of the present invention that includes a mixture of NC sizes;

FIG. 13(*b*) illustrates a schematic diagram (top view) of an embodiment of a recordable media of the present invention the includes a 2D ordered monolayer situated between electrodes and atop an insulator;

FIG. 13(*c*) illustrates a schematic diagram (perspective view) of an embodiment of a recordable media of the present invention the includes a 3D NC array situated between electrodes and atop an insulator;

FIG. 19(*b*) is a scanning electron micrograph of the memory device in FIG. 19(*a*); increased magnification—scale bar is 10 microns;

FIG. 19(*c*) is a transmission electron micrograph of the memory device in FIG. 19(*a*); increased magnification—scale bar is 20 nm;

DETAILED DESCRIPTION OF ILLUSTRATIVE EMBODIMENTS

Figure 1:
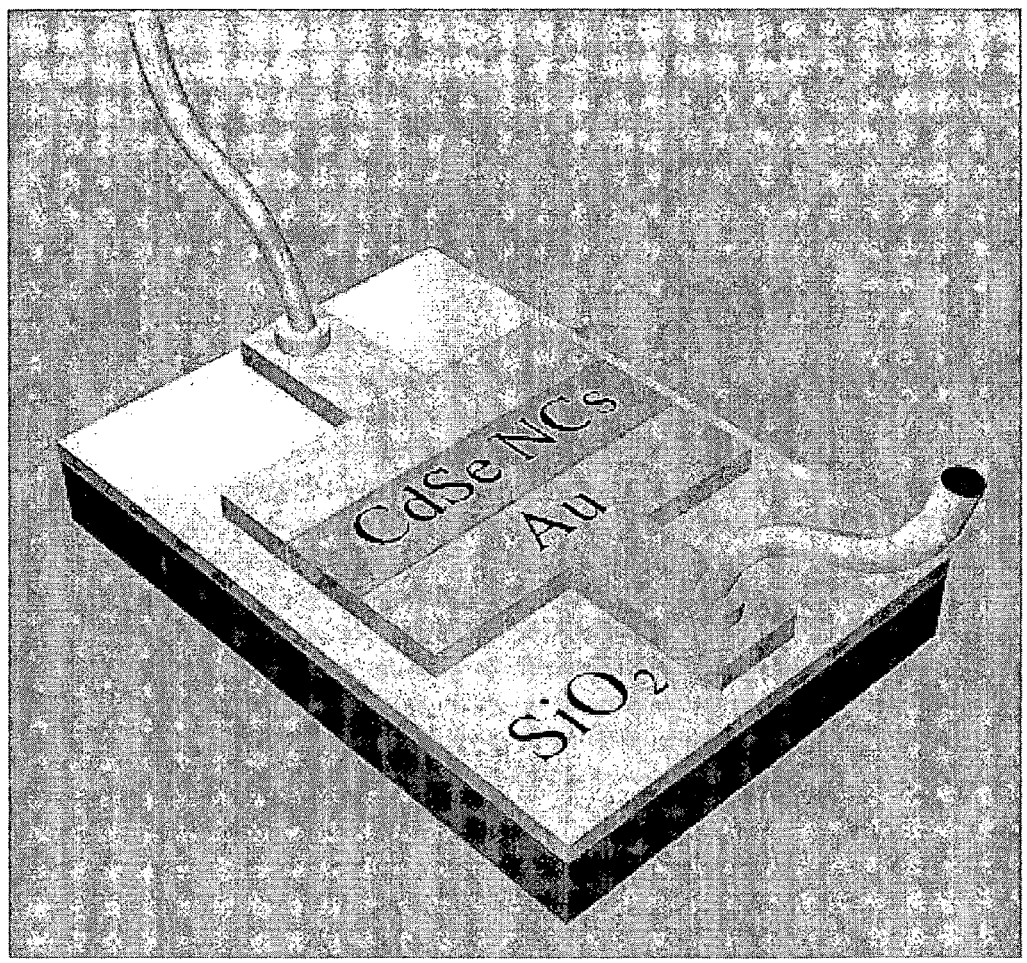
FIG. 1(a) depicts a schematic of an embodiment of a device of the present invention; 1-mm wide electrodes are separated by 2 μm; the back gate is grounded in this embodiment.
FIG. 1(b) is a transmission electron micrograph of a NC film used in the device of FIG. 1(a); the scale bar is 50 nm.
FIG. 1(c) depicts current-voltage curves at room temperature (dashed lines) and at 77K (solid lines) for an array of 5 nm TOPO-capped CdSe nanocrystals (NCs) in the dark and during excitation with green laser; the voltage sweep rate is 1 V/s.

The present invention may be understood more readily by reference to the following detailed description taken in connection with the accompanying figures and examples, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

Nanocrystal quantum dot recordable media and memory devices are provided in various aspects of the present invention. In certain embodiments, for example, memory effects in the electronic transport in colloidal undoped CdSe NC quantum dot arrays give rise to the development of CdSe NC quantum dot recordable media and memory devices. In these embodiments, conduction through a NC array can be reduced by applying a negative voltage and then reset with a positive voltage for operating the memory devices. Light can be used to reset or even to increase conduction in the NC array. The switching of the conduction in CdSe NC arrays is sensitive to the value and duration of the laser and voltage pulses. The ability to controllably switch NC array conduction is exploited to fabricate memory devices composed of CdSe NCs. Such devices are advantageous for several reasons. (i) Production of large quantities of CdSe NCs is easy and inexpensive. (ii) CdSe NC spectra are dependent on the NC size, which enables selective memory resetting with visible light in devices composed of different size NCs. For example, in a device composed of red and blue NCs, green light can reset the red NCs but not the blue NCs. (iii) The NC memories described herein are robust, re-writable and persist for long times.

As used herein, "recordable media" refers to a material that can by altered in some way (e.g., by using a physical, chemical, optical or quantum mechanical writing step) to record at least one bit or qubit of information. In other embodiments, recordable media can be recorded with at least one bit or qubit of information, and the information can be subsequently read in some way (e.g., by using a physical, chemical, optical or quantum mechanical reading step). In still other embodiments, recordable media can be recorded in some way with at least one bit or qubit of information, and the information can be subsequently erased in some way (e.g., by using a physical, chemical, optical or quantum mechanical writing step). And in further embodiments, recordable media can be recorded with at least one bit or qubit of information, and the information can be subsequently read and erased one or more times.

Figure 5:
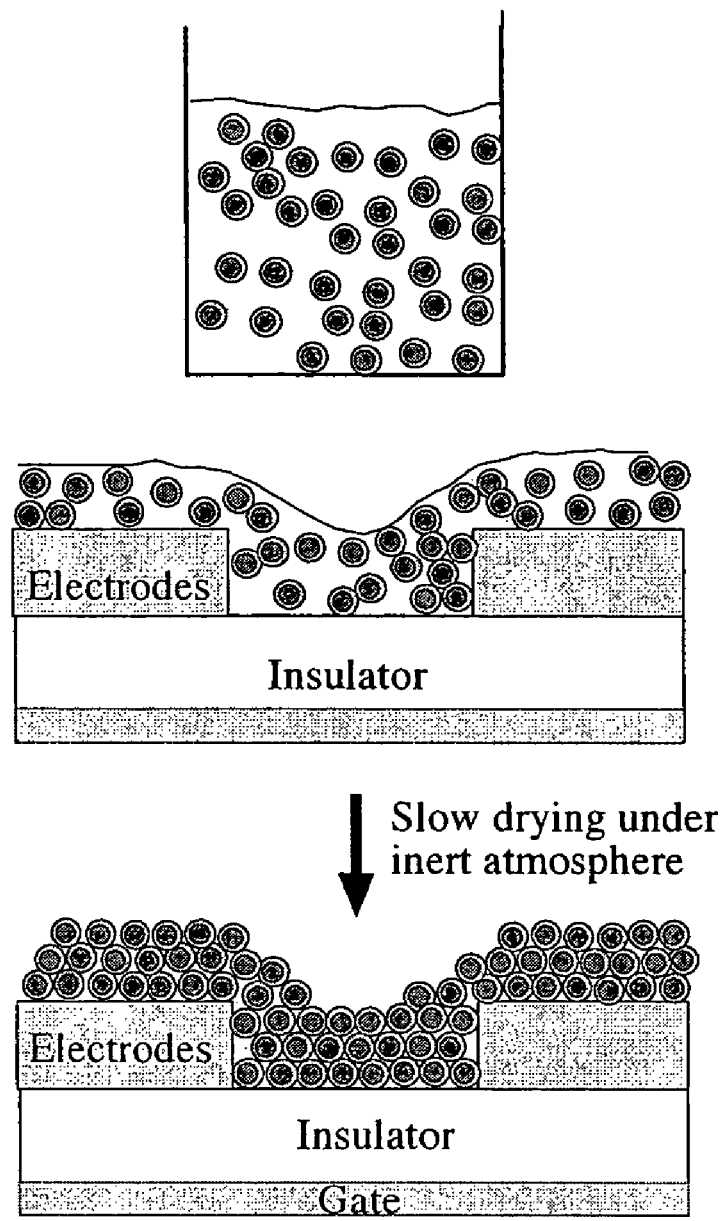
FIG. 5 depicts an embodiment of the self-assembly process for preparing a memory element of the present invention.

Device Geometry and Fabrication. The memory devices of the present invention typical include a field-effect transistor geometry: at least two metal electrodes (the source and the drain) and, optionally, a gate. Referring to FIG. 5, a process for preparing a suitable memory device is schematically illustrated. From top to bottom: a solution of colloidal nanocrystals (e.g., CdSe and CdSe/ZnS) is typically provided dispersed in a liquid medium. The liquid medium can be aqueous, but it is preferably non-aqueous. Suitable non-aqueous liquid medium includes virtually any type of organic solvent or solution capable of dispersing semiconducting nanocrystals. Preferred solvents and solvent solutions include hydrocarbons, such as 9:1 hexane: octane, hexane, and toluene. The nanocrystals are typically spherical in shape and have a diameter in the range of from ~3 nm to ~8 nm. As used herein, the symbol ("~") means "about". The nanocrystals are typically capped with organic ligands. Suitable ligands include TOPO (tri-octylphosphine oxide) to provide ~1.1 nm long ligands. Other ligands known in the art can also be suitably used. For example, pyridine is also a suitable ligand that is about 0.7 nm in length.

Nanocrystals, such as CdSe, are commercially available from Evident Technologies, Troy, N.Y. (www.evidenttech.com). Nanocrystals are typically shipped in toluene and can undergo solvent exchange, if desired. A variety of nanocrystals besides CdSe are also suitable in the present invention. Nanocrystals may vary in composition as well as in shape. Examples of varying nanocrystal compositions include CdSe, CdSe/ZnS (core is from CdSe ~3-8 nm thick, shell is from ZnS 1-2 nm thick, and then ligand is on the surface), CdTe, Si and other semiconductor materials. Particularly preferred NCs are CdSe and CdSe/ZnS. Ligand molecules can be: phosphines (tri-octyl phosphine oxide—TOPO, tri-butylphosphine oxide—TBPO), pyridines, oleic acid, thiols, alkanes, amines, carboxylic acid, pyrazine. Ligands can be exchanged. For example, TOPO can be replaced by TBPO, pyridine, and the like.

Any suitable nanocrystal can include any particle capable of exhibiting quantum confinement effects, electrical hysteresis properties, and be a semiconductor. Examples of varying geometries include spherical, core/shell, polyhedral and rod-shaped. FIG. 5 shows a configuration of a nanocrystal layer situated upon two electrodes and an insulator. As depicted, the separation between the electrodes is about eight NC diameters wide. This separation distance can vary between 1 NC wide up to about a thousand nanocrystals wide. Likewise, the depth of the NC layer situated between the electrodes can vary from one NC monolayer up to hundreds of NC monolayers. A variety of combinations of different nanocrystals can also be suitably used, for example, to form self-assembled superlattices of two or more different types, or different sizes, or any combination thereof, of nanocrystals.

In other embodiments, memory devices and recordable media can also be prepared using any of a wide variety of nanocrystals and combinations thereof. For example, PbSe nanocrystals are commercially available from Evident Technologies, Troy, N.Y. PbSe nanocrystals useful in various embodiments of the present invention range in size from about 1 nm to about 10 nm in diameter, and typically from about 2 nm to about 8 nm in diameter. Blends of different sizes of nanocrystals may also be used, for example for tailoring the absorbance and emission spectrum of an optoelectronic device. PbSe nanocrystals may have a core-shell structure composed of a semiconducting core material and an optional semiconducting shell material. PbSe nanocrystals may comprise substantially a core. Suitable nanocrystals can also comprise one or more ligand molecules attached or adsorbed to the surface of the quantum dot. Suitable ligand molecules can also include organic moieties that give rise to a ligand layer, preferably an organic ligand layer, of from about 0.1 nm to 10 nm thick, typically from about 0.2 nm to about 5 nm thick, and more typically of from about 0.5 nm to about 3 nm thick. In certain embodiments, PbSe nanocrystals can include surfactant fragments, such as oleic acid fragments, which can be about 1 nm to about 3 nm in length.

In addition to PbSe, certain other nanocrystals may also be used in the present invention, many of which are described by Bawendi et al., in WO2004078027 A2, the description of which pertaining to the synthesis of nanocrystals is incorporated by reference herein. A suitable nanocrystal can be a member of a population of nanocrystals having a narrow size distribution. A suitable nanocrystal can be a sphere, rod, disk, or other shape. Spherical nanocrystals are preferred.

In some embodiments, suitable nanocrystals are composed of a semiconductor material having a particle size in the range of from about 0.5 nm to about 20 nm, typically in the range of from about 1 nm to about 15 nm, more typically in the range of from about 2 nm to about 12 nm, and even more typically in the range of from about 3 nm to about 9 nm. In several embodiments, suitable nanocrystals include a composition having the formula MX, where M is lead, tin, germanium, cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof.

The semiconductor forming the nanocrystal can include Group II-VI compounds, Group II-V compounds, Group III-VI compounds, Group III-V compounds, Group IV-VI compounds, Group I-III-VI compounds, Group II-IV-VI compounds, and Group II-IV-V compounds, for example, ZnS, ZnSe, ZnTe, CdS, CdTe, HgS, HgSe, HgTe, AlN, AlP, AlAs, AlSb, GaN, GaP, GaAs, GaSb, GaSe, InN, InP, IlAs, InSb, TlN, TlP, TlAs, TlSb, PbS, PbSe, PbTe, or mixtures thereof. Nanocrystals prepared from Group IV-VI (e.g., PbSe and InAs) are particularly suitable, with PbSe being preferred.

The population of nanocrystals can have a narrow size distribution. For example, the population can be monodisperse and can exhibit less than about 15% RMS ("Root-Mean-Square") deviation in diameter of the nanocrystals, preferably less than about 10% RMS, more preferably less than about 5% RMS. In several embodiments, the population of nanocrystals can be polydisperse, for example exhibiting a deviation in diameter of greater than about 15% RMS, preferably greater than about 25% RMS, and more preferably greater than about 35% RMS. In several embodiments, the size distribution can be bimodal, for example composed of a population of two narrow size distribution nanocrystals, trimodal, for example composed of a population of three narrow size distribution nanocrystals, or polymodal, for example composed of a population of n narrow size distribution nanocrystals, wherein n is 4 or greater.

Many suitable nanocrystals are commercially available, for example, from Evident Technologies, Troy, N.Y. The preparation of a wide variety of nanocrystals are also known to those skilled in the art. For example, U.S. Pat. No. 6,322,901 to Bawendi et al., incorporated herein by reference, discloses the synthesis of CdX/ZnY core/shell nanoparticles, where X is S, Se and Te, and Y is S and Se. These methods of preparing semiconductor nanocrystals include pyrolysis of organometallic reagents, such as dimethyl cadmium, injected into a hot, coordinating agent. This permits discrete nucleation and results in the controlled growth of macroscopic quantities of nanocrystals. Suitable nanocrystals can be synthesized using colloidal growth process and can produce a monodisperse particle population. Colloidal growth occurs by rapidly injecting an M donor and an X donor into a hot coordinating agent. The injection produces a nucleus that can be grown in a controlled manner to form a nanocrystal. The reaction mixture can be gently heated to grow and anneal the nanocrystal. Both the average size and the size distribution of the nanocrystals in a sample typically depend on the growth temperature. The growth temperature for maintaining steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be related to as a size. The process of controlled growth and annealing of the nanocrystals in the coordinating agent that follows nucleation can also result in uniform surface derivatization and regular core structures. As the size distribution sharpens, the temperature can be raised to maintain steady growth. By adding more M donor or X donor, the growth period can be shortened.

In preparing certain embodiments of nanocrystal memory devices of the present invention, about 5-10 microliters of a highly-concentrated solution (~10 mg/ml) is drop-cast with a syringe on the device. Nanocrystals subsequently self-assemble onto the insulator and electrodes as the solvent evaporates due to van der Walls forces among the NCs, the electrodes, and the insulator. Preferably, nanocrystals assemble on top of electrodes and the insulator (e.g., silicon dioxide), and in between the electrically conductive electrodes. Suitable electrically conductive electrodes may be a metal (e.g., gold, silver, copper or platinum), a molecular wire, or a carbon nanotube. Solvent evaporation rate typically depends on the solvent composition and the ambient conditions (e.g., temperature, pressure, gas composition). The resulting nanocrystal films can be dried in a range of atmospheres including nitrogen gas, argon, helium, vacuum, and the like.

Figure 6:
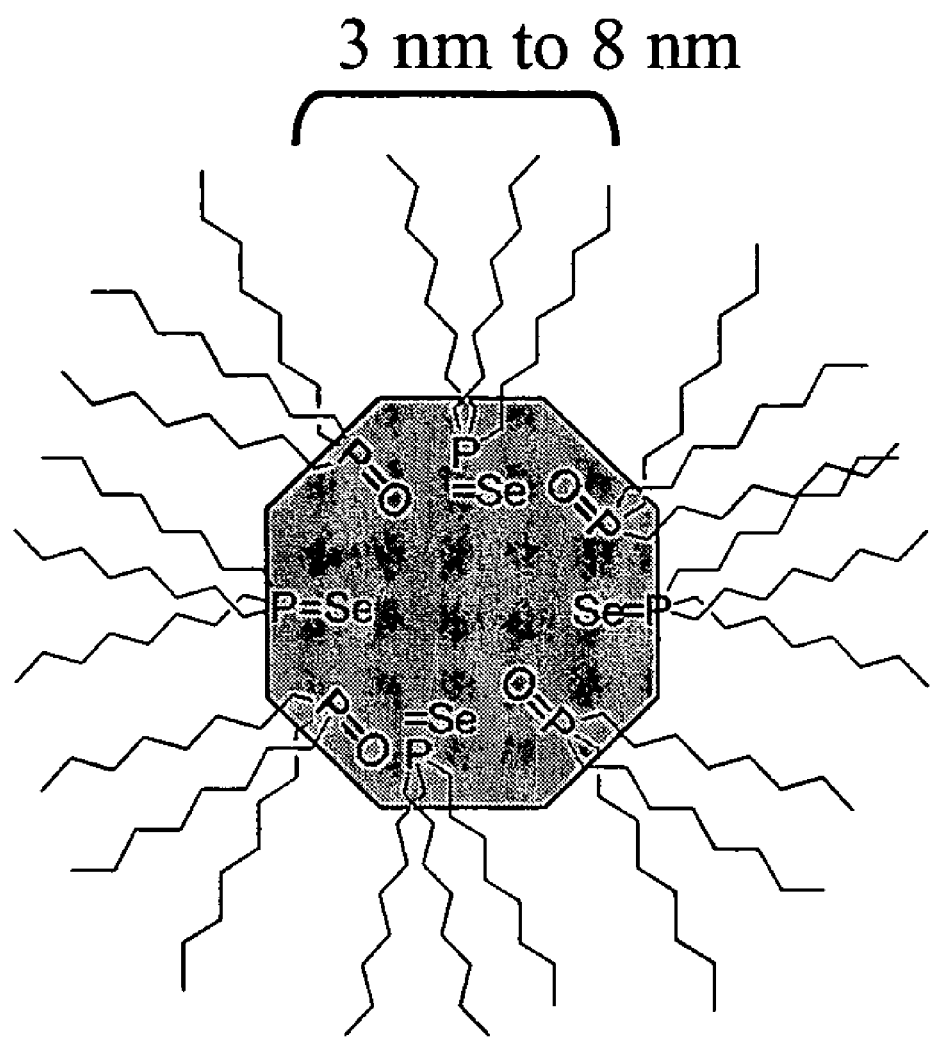
FIG. 6 is a schematic drawing of a nanocrystal used in various embodiments of the present invention.

Referring to FIG. 6, there is provided a schematic drawing of one nanocrystal. The core composition of the nanocrystal is preferably CdSe or CdSe/ZnS, and the 'hairy', floppy molecules are ligands. In this schematics, TOPO is shown (8 carbon chains). Other ligands useful for preparing semiconducting nanocrystals are also suitable. Nanocrystals suitable in the present invention typically have a length scale in the range of about 3 nm to about 8 nm, excluding the presence of ligands. Suitable ligands, such as pyridine or TOPO, can be used to add an additional ~0.5 to ~4 nm to the exterior surface of the nanocrystals.

Figure 7:
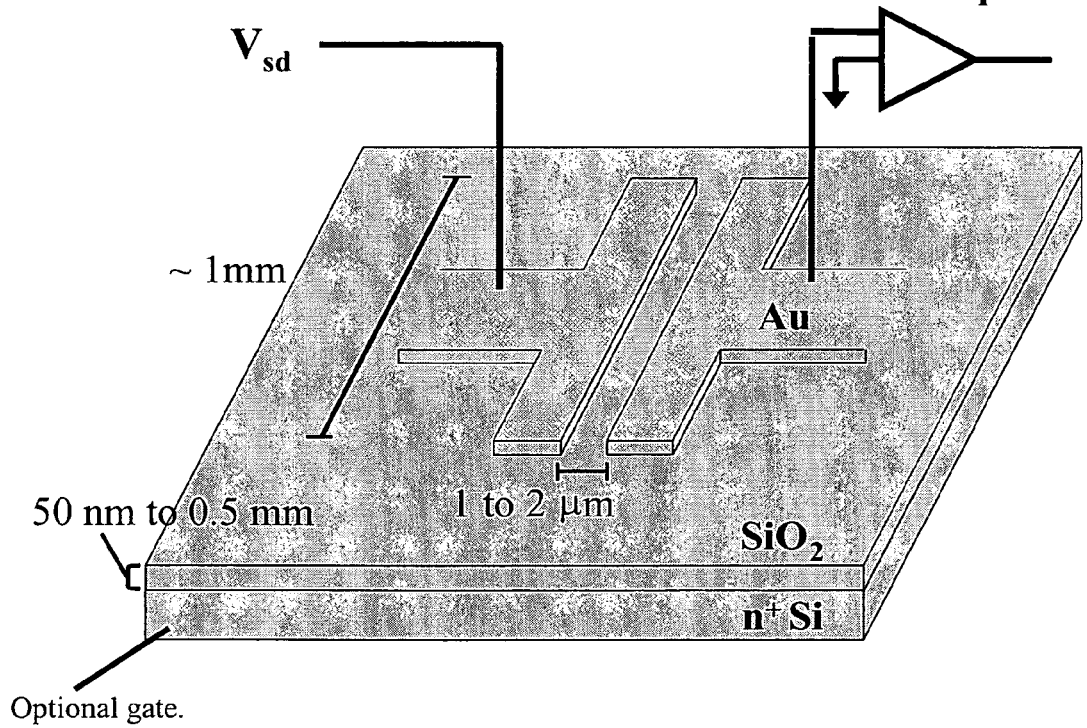
FIG. 7 depicts a device illustrating electrode/substrate geometry and dimensions used in certain embodiments of the present invention.

Referring to FIG. 7, there is provided a device for practicing certain embodiments of the present invention. This device depicts two gold electrodes (source and drain) residing on an insulating silicon dioxide layer. The length of the gold electrodes can vary widely depending on the application, for example, ranging from about 1 micron to about 10 mm, or from about 5 microns to about 5 mm, or from about 20 microns to about 2 mm. The length of the gold electrodes of the embodiment illustrated in FIG. 7 is about 1 mm. The oxide layer in this embodiment can reside on conductive substrates. Conductive substrates (including conductive layers) are preferably used but are not required. Conductive substrates and layers can be patterned into a gate for use in a FET-type memory element. Suitable conductive substrates and layers typically include n-doped silicon, or some other highly doped semiconductor such that the substrate is highly conducting. In certain preferred embodiments that incorporate a gate, the gate voltage is typically applied to the conductive substrate or layer. The conductive substrate or layer typically resides adjacent to the insulating layer and separate from the source and drain electrodes. Suitable conductive substrates or layer have a thickness in the range of from about 50 nm to about 0.5 mm, or even higher.

Suitable insulator layers, such as silicon dioxide, are preferably grown on a surface of an n-doped silicon substrate. The thickness of the silicon dioxide layer can vary from ~50 nm to ~500 nm. Preferred memory devices have a silicon oxide layer thickness of about 300 nm. Suitable conductive substrates having thermally grown oxides are commercially available.

In certain embodiments, nanocrystal memory devices can also be made using silicon nitride insulator layers, and a metallic conductive layer, such as gold ("Au"). Suitable electrically conducting source and drain electrodes, such as gold, are applied to the surface of the insulator layer opposite the conductive layer. Suitable nanocrystals, such as 3 nm CdSe, can be applied to a gap using a suitable process, such as self-assembly, between the source and drain electrodes as provided hereinabove.

Suitable substrates can be cleaved into smaller chips (e.g., ~3×3 mm) in some embodiments. Prior to fabrication of the electrodes, the chips can be cleaned in an ultrasonic bath for about 15 minutes. Any type of suitable ultrasonic bath cleaning solution can be used, which can include acetone, methanol, isopropanol or any combination thereof. Devices can also be additionally cleaned with plasma (e.g., oxygen) prior to, or subsequent to, ultrasonic cleaning. Oxygen plasma can be used to remove organic impurities on the surfaces of the chips.

After the chips are cleaned, the electrodes are applied using a suitable electrode patterning methodology known in the art. Optical lithography or electron beam lithography can be used to define the electrode patterns. For example, optical lithography can be used to prepare the electrodes as follows: Spin 1813 Shipley resist at 5000 rpm (rotations per minute) for 60 s. This covers the surface of the chip with a uniform resist layer of a few microns thick. Expose the substrate with UV light through a lithography mask which has the electrode patterns etched in it. This can be done with the Karl Suss Mask Aligner. Develop in a Shipley developer for 1 min. This leaves the electrode pattern on the surface. (Resist can be removed where the electrodes will be, while it can be left at other places). Evaporate electrodes: first, evaporate a thin layer (~5-50 nm) of adhesion metal such as Cr or Ti, and then evaporate gold (or some other metal). The Au layer can be as thin as ~5-10 nm and as thick as ~1 micron. Clean the chips again with acetone, methanol and isopropanol and adhere them into a chip carrier (standard 24-pin chip carriers in microelectronics industry, commercially available) with a silver paste. The silver paste can be conducting to serve as a good electrical connection to the back gate (n-doped silicon). Cure the silver paste for ~45 min at ~120 Celsius in a standard oven. Wire bond a gold wire between the pre-patterned electrodes and the gold-plated pins on the chip carrier with a suitable wire bonder, e.g., commercially available from Kulicke & Sofa (Israel). Deposit nanocrystals by drop-casting them from solution as described hereinabove. The nanocrystal film can be from a monolayer to hundreds of monolayers thick (i.e., from ~5 nm to ~1 micron thick). Dry the nanocrystal film, for example using 1) nitrogen gas overnight, or 2) place in a cryostat and dry in vacuum overnight. Place the chip carrier in the cryostat, wire up the electronics outside the cryostat and measure.

In another embodiment, electron beam lithography can be used to prepare the electrodes using procedures that are similar to the optical lithography procedure, with the exception that PMMA can be used as a resist, and the electrode pattern can be written with an electron beam. A suitable electron beam can be computer-controlled to 'write' the desired, pre-programmed electrode pattern. A computer-aided design ("CAD") program can be preferably used to draw the electrode/device patterns. Ten or more devices can be prepared on one 3×3 mm chip.

After the devices are provided with insulator layer, source and drain electrodes, optional gate, and nanocrystals, the devices are preferably annealed at temperatures at least about 300° C., and preferably at least about 350° C. Higher annealing temperatures apparently produce very conducting nanocrystal films that can be advantageously used to prepare and operate memory devices of the present invention.

Electrical Setup and Procedure. Referring to FIG. 7, a voltage (Vsd) can be applied to the source electrode using a suitable power supply (e.g., Yokogawa 7651), and a programmable bipolar operational amplifier (e.g., KEPCO 500M). The voltage can be read with a suitable voltage meter (e.g., Agilent 34401A Digital Multimeter). The current at the drain electrode can be measured with a suitable current amplifier and voltage meter (e.g., Keithley 428 Current Amplifier and a Agilent 34401A Digital Multimeter).

Certain preferred embodiments of the memory devices of the present invention can be operated under control by use of computer software, e.g., LabView™ software. In certain embodiments, the gate (n-doped silicon layer) can be at zero potential (i.e., grounded). A non-zero gate voltage can be applied, but in the present embodiment only the source voltage was controlled while keeping the gate grounded.

Voltage sequences for operating certain embodiments of the memory devices of the present invention are provided herein below. The memory devices can be suitably operated in a solid, liquid, gas, or vacuum environment that does not degrade the performance of the nanocrystal film.

Nanocrystal films kept in air typically degrade (e.g., oxidize), which can result in a decrease in electrical conduction through the film. Accordingly, in certain embodiments suitable barrier layers can be deposited, such as an additional insulator layer on top of the nanocrystal film, to protect the nanocrystals from oxygen (see, e.g., FIG. 8). This additional insulator layer can be silicon oxide, silicon nitride, silicon oxynitride, known barrier polymers such as polyimide, PCTE, PTFE, PMMA, and various other materials that can be more insulating compared to the nanocrystal film.

In one embodiment of the present invention, there are provided electronic memory devices that incorporate nanocrystals. The memory effect can be present or manifested in the electrical response of nanocrystals to the positive and negative voltages, to the back gate voltages, to light, and to temperature.

Figure 8:
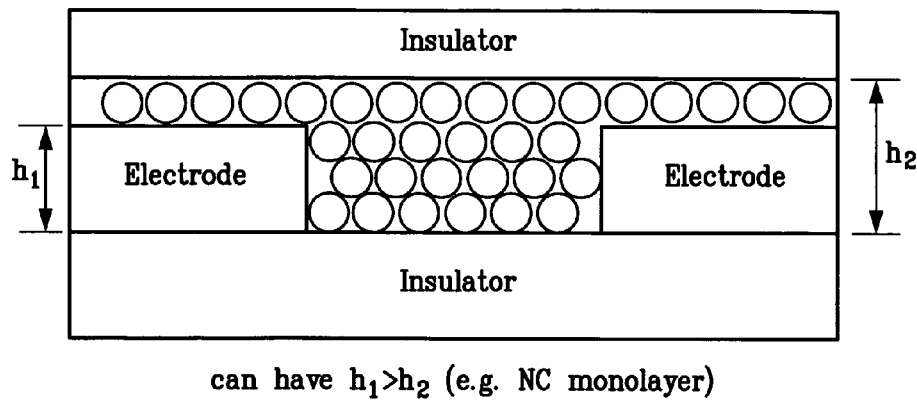
FIG. 8 illustrates a schematic diagram of an embodiment of a recordable media of the present invention.

In one embodiment of the present invention, there are provided memory devices that do not require use of the gate. The gate is not necessary for the memory operation. It can be used for extra flexibility of the devices, but it's not necessary. Referring to FIG. 8, there is provided an embodiment of a recordable media that includes two electrodes in electrical contact with nanocrystals. The nanocrystals can be sandwiched between two insulator layers.

In several embodiments of the present invention, there are provided memory devices in which no materials, such as polymers, are required other than those capping the nanocrystals. The nanocrystal capping layers can be sufficient, and no additional polymers are needed.

Figure 9:
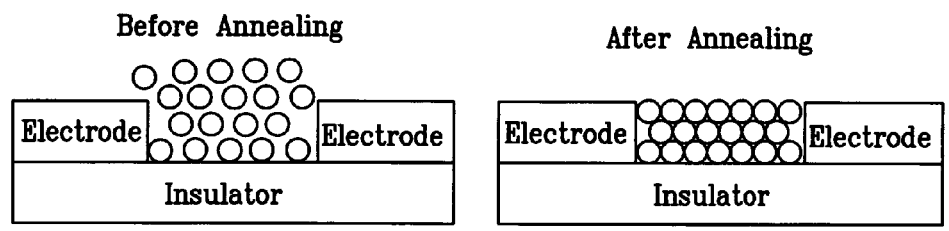
FIG. 9 illustrates the effects of annealing the nanocrystal layer of an embodiment of a recordable media of the present invention; left—before annealing; right—after annealing.

In several embodiments of the present invention, there are provided methods for fabricating memory devices and recordable media composed of conductive nanocrystal films. Referring to FIG. 9, these methods comprise, among other things, the annealing of the nanocrystal films. Annealing can be used to control the separation and dielectric constant of the material (e.g., polymer) which separates the adjacent nanocrystals. The tunneling current through the nanocrystal film increases as the separation between nanocrystals decreases.

Figure 10:
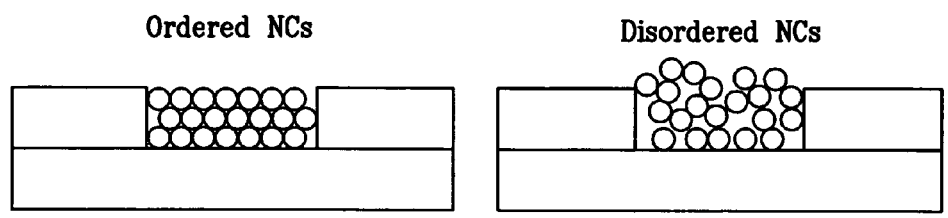
FIG. 10 illustrates a schematic diagram of two embodiments of a recordable media of the present invention having ordered NCs (left) and disordered NCs (right)

In several embodiments of the present invention, there are provided memory devices and recordable media that do not require ordered nanocrystal arrays. Referring to FIG. 10, the recordable media works well when nanocrystal arrays are disordered.

Figure 11:
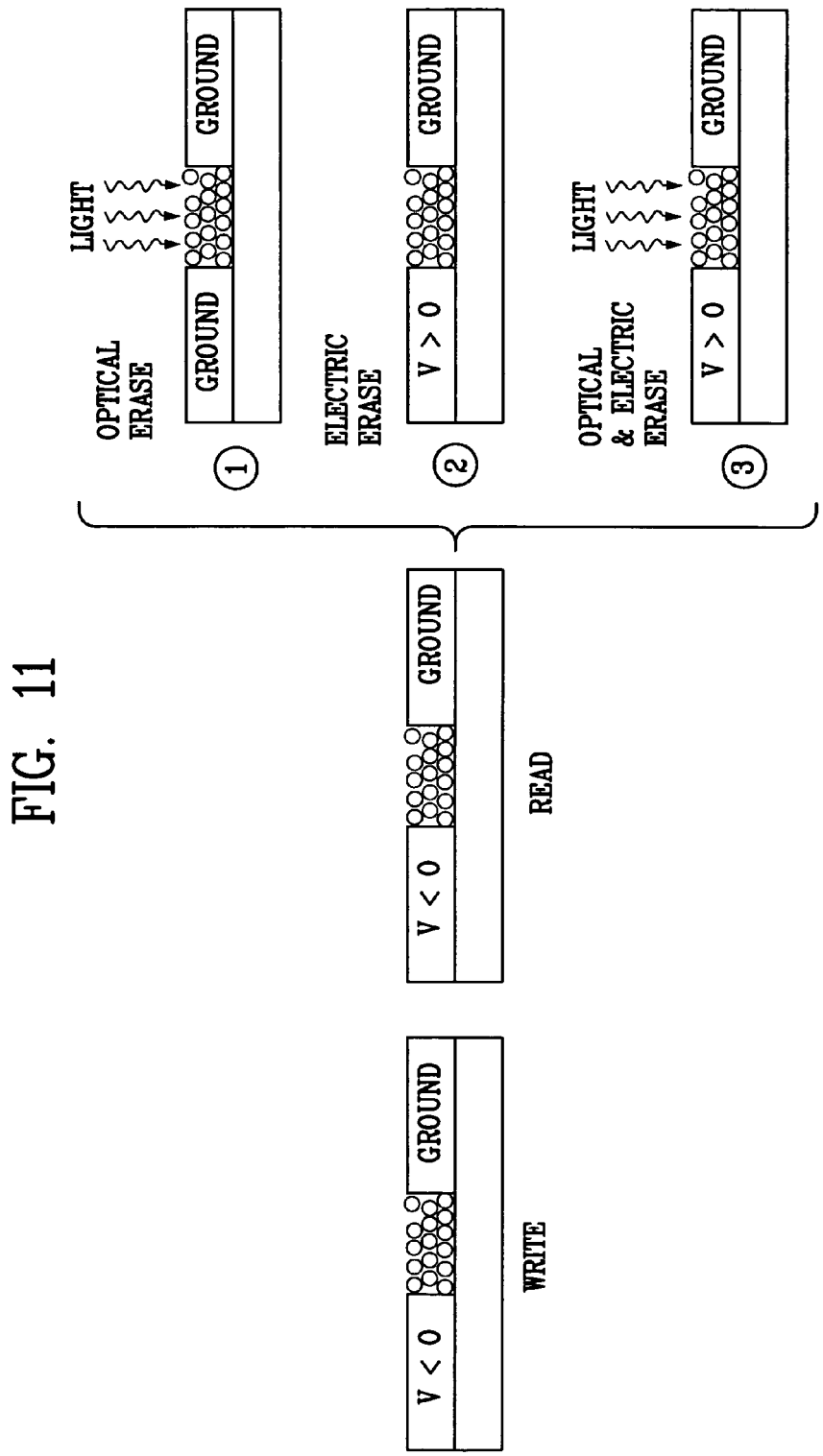
FIG. 11 illustrates several embodiments for writing, reading and erasing an embodiment of a recordable media of the present invention.

In several embodiments of the present invention, there are provided nanocrystal-based memory devices and recordable media in which the memory can be reset or erased optically (e.g., when devices are illuminated), electrically (e.g., when voltages are applied to the devices), and thermally (e.g., when the temperature is changed). Referring to FIG. 11, an embodiment of a recordable media of the present invention is shown being written and read using a negative voltage. The memory can be subsequently erased using light, positive voltage, or a combination of both. Accordingly, there are provided memory devices and recordable media that can be operated as both volatile and nonvolatile memory.

Figure 12:
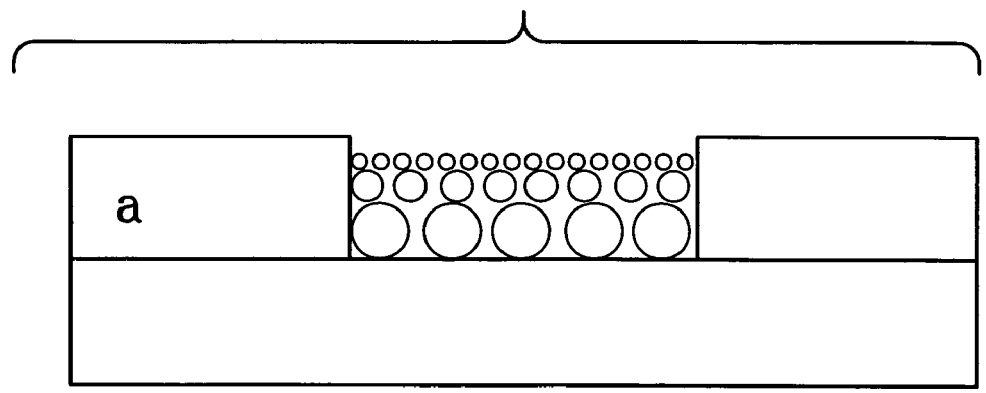
FIG. 12(*c*) illustrates a schematic diagram of an embodiment of a recordable media of the present invention in which two different NCs are separated by an additional electrode.
Figure 12:
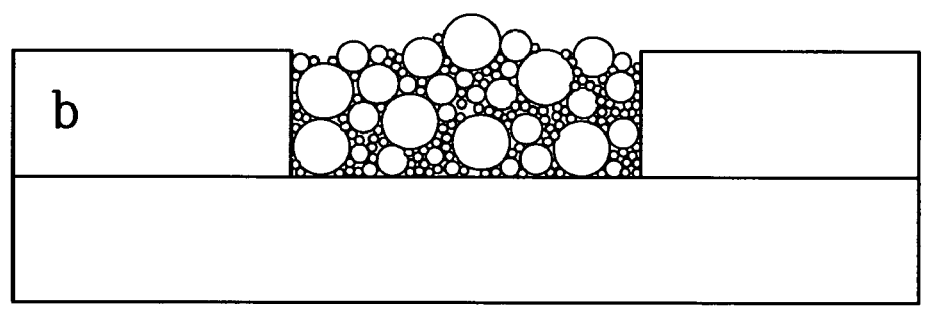
Figure 12:
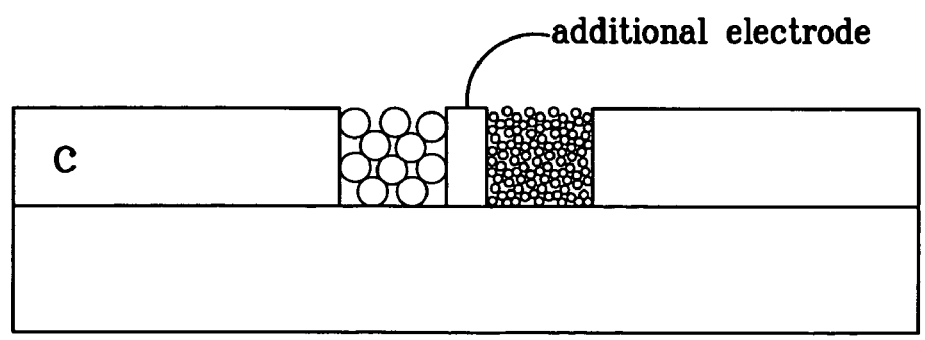

In several embodiments of the present invention, there are provided memory devices and recordable media composed of nanocrystals of different sizes so that the memory can be selectively reset or erased. Referring to FIGS. 12(a), (b) and (c), for example, a device prepared using a recordable media of the present invention composed of red and blue nanocrystals can be selectively reset with green light. This means that if the devices are illuminated with green light, the memory in the recordable media can be erased in red nanocrystals, but not erased in blue nanocrystals. When the same device can be erased electrically (i.e., with voltages), then the memory can be erased completely. Suitable green nanocrystals include CdSe about 2.8 nm in diameter and CdSe/ZnS about 2.4 to 2.8 nm in diameter. Suitable red nanocrystals include CdSe about 5.5 nm in diameter and CdSe/ZnS about 5 nm in diameter. Suitable Blue/UV nanocrystals include CdSe about 2 nm in diameter and CdSe/ZnS about 2 nm, or smaller, in diameter. FIG. 12(a) depicts embodiments having layers of different nanocrystals. FIG. 12(b) depicts embodiments having a mixture (e.g., random mixture) of nanocrystals of different sizes, different compositions, or both. FIG. 12(c) depicts an array, grid and assembly of two adjacent memory elements where each memory element of an embodiment of a memory device comprises nanocrystals that can be the same or different. As depicted, the left memory element can be composed of larger diameter NCs and the right memory element can be composed of smaller diameter NCs. The compositions of the NCs may be the same or different in the memory elements.

Figure 13A:
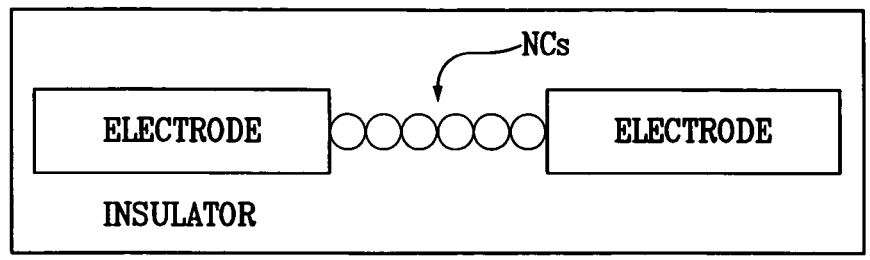
FIG. 13(*a*) illustrates a schematic diagram (top view) of an embodiment of a recordable media of the present invention the includes a 1D array of NCs situated between electrodes and atop an insulator.
Figure 13B:
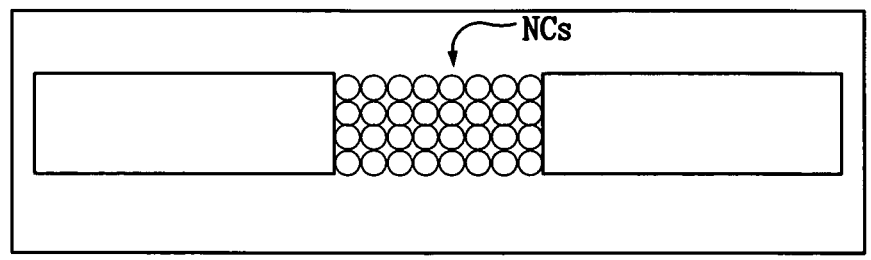
Figure 13C:
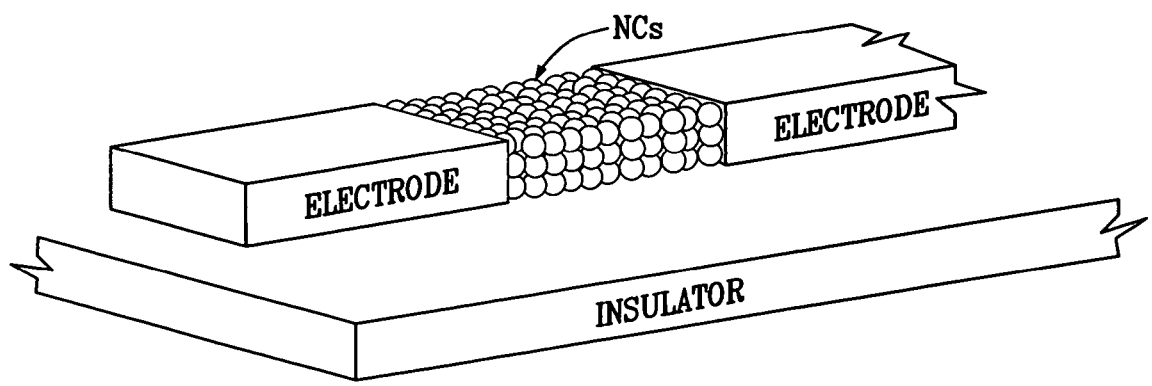

In several embodiments of the present invention, there are provided memory devices and recordable media in which nanocrystals can be arranged in 2D or 3D geometries, as well as in 1D arrays. Referring to FIG. 13(a), a 1D NC array memory element is provide. Referring to FIG. 13(b), a 2D NC array memory element is provided. Referring to FIG. 13(c), a 3D NC array memory element is provided. Nanocrystal arrays can be ordered or disordered in various embodiments.

Figure 14:
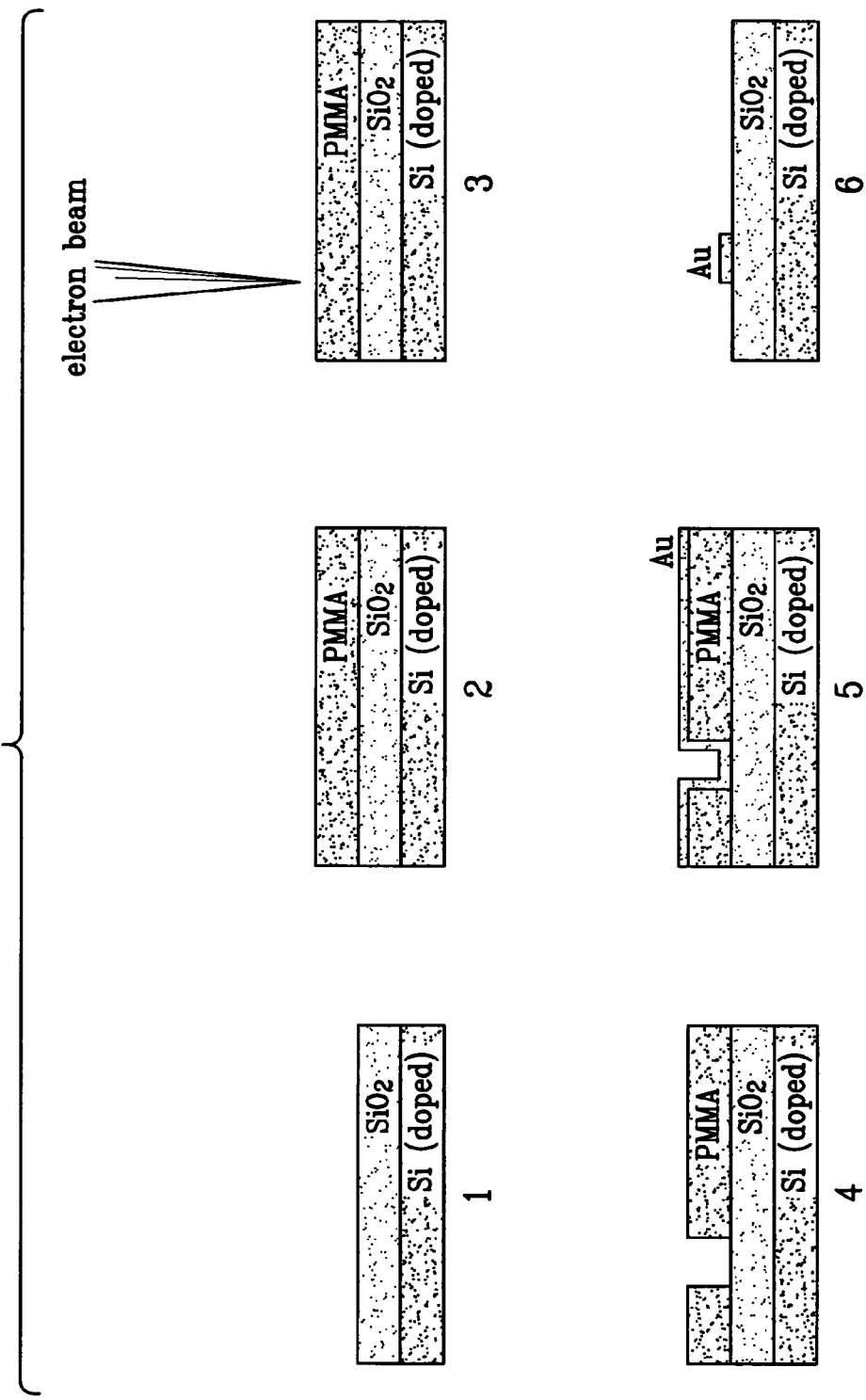
FIG. 14 illustrates a process diagram (side view) of an embodiment of a process of preparing electrodes of a memory device or a recordable media using electron beam lithography.
Figure 15:
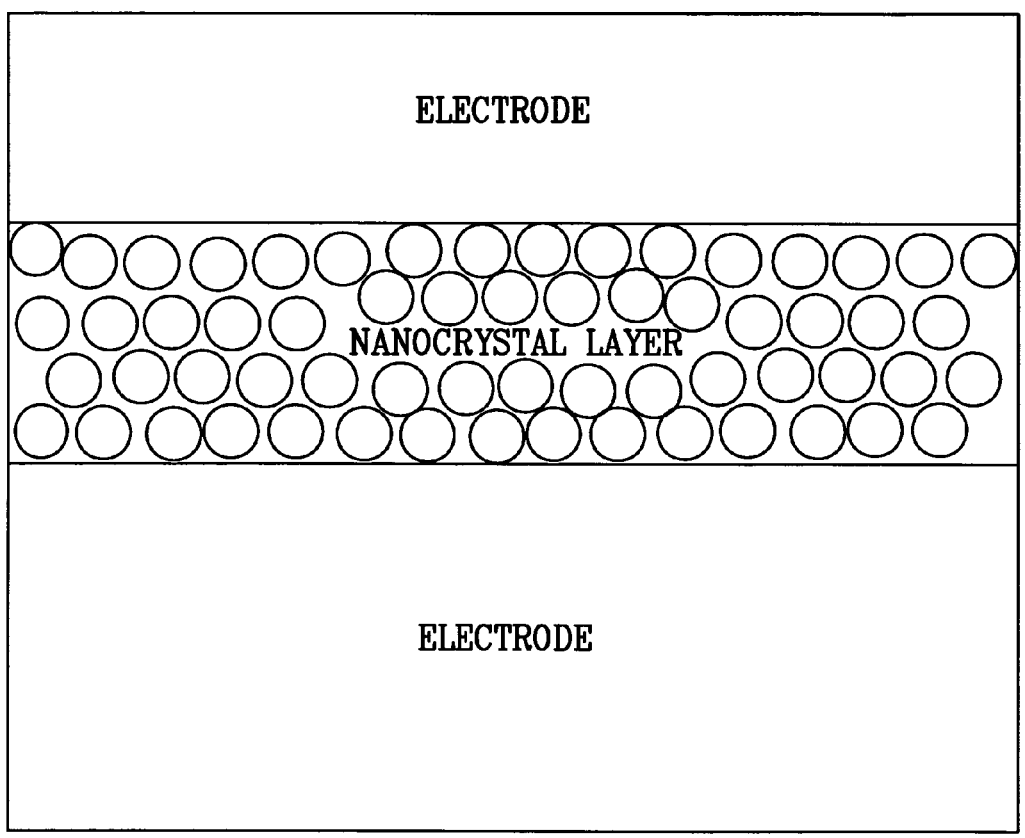
FIG. 15 illustrates a schematic diagram (side view) of an embodiment of a recordable media of the present invention the includes a sandwich structure of a nanocrystal layer situated between two electrodes.

Referring to FIG. 14, there is depicted a six step process for patterning gold electrodes on silicon dioxide substrates. Clean the silicon oxide (e.g., on doped silicon) substrate, spin coat PMMA resist onto substrate and then bake to crosslink PMMA; expose PMMA to e-beam in areas where an electrode is desired; develop (i.e., remove) the exposed PMMA; evaporate gold onto surface; lift-off the remaining PMMA, which removes gold where it is not desired.

Figure 16:
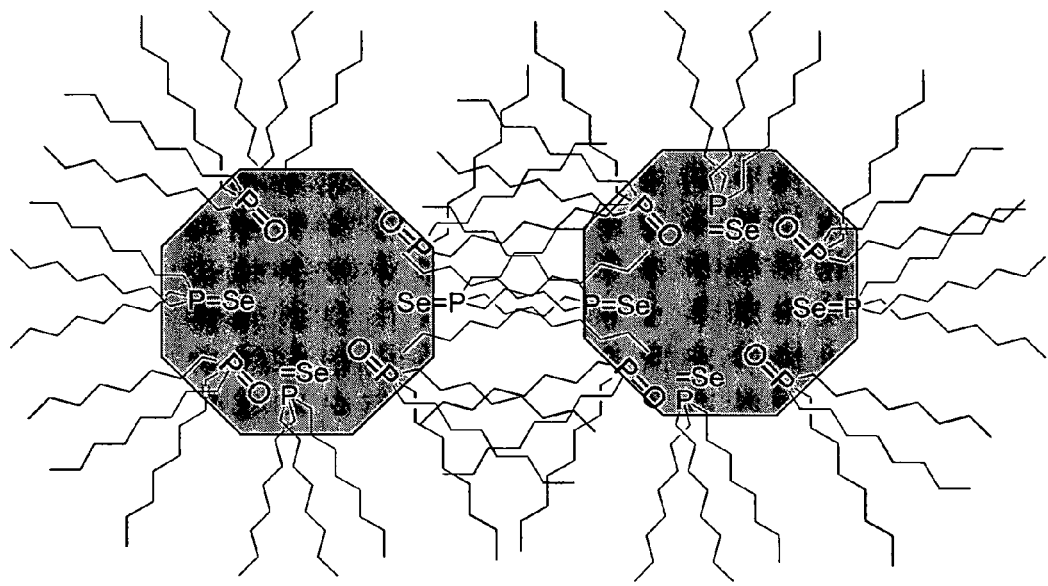
FIG. 16 illustrates a schematic diagram of two nearby CdSe nanocrystals with TOPO linker molecules.

Referring to FIG. 16, there is provided a schematic of two nearby CdSe nanocrystals with alkane (e.g., tri-octylphosphine oxide—TOPO) linker molecules. The distance between nanocrystals can be approximately equal to the length of a linker molecule. When the nanocrystal films are annealed, this inter-dot distance decreases.

Figure 17:
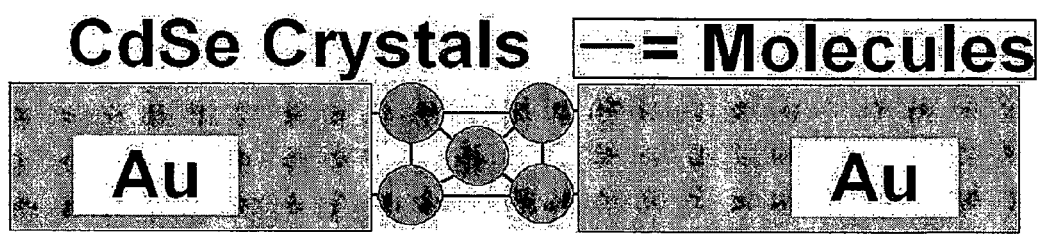
FIG. 17 illustrates a schematic diagram (side view) of an embodiment of a memory element of the present invention composed of five molecularly-bridged CdSe nanocrystals.

Referring to FIG. 17, there is also provided an embodiment of a small memory element composed of five molecularly-bridged CdSe NCs in between metal electrodes. The electrons tunnel through the array from one electrode to the other. This device can be connected as in FIG. 7.

Figure 18:
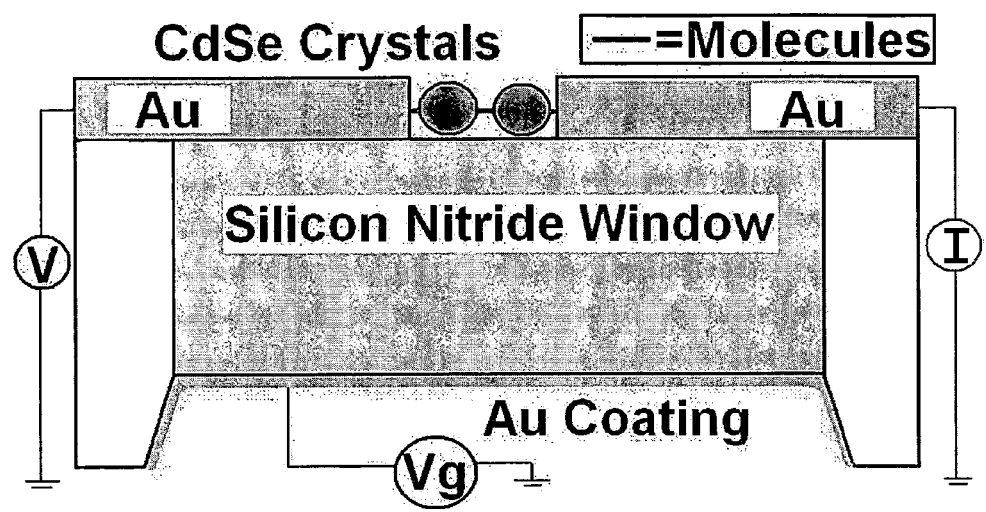
FIG. 18 illustrates a schematic diagram of an embodiment of a memory element of the present invention including a silicon nitride substrate.

Referring to FIG. 18, there is also provided an embodiment of device geometry and electrical connections for a device on a silicon nitride substrate, with two electrodes and the gate.

Voltage V can be applied to the source electrode and current I can be measured at the drain electrode. Vg=0V (e.g., voltage on the gate can be zero).

Figure 19:
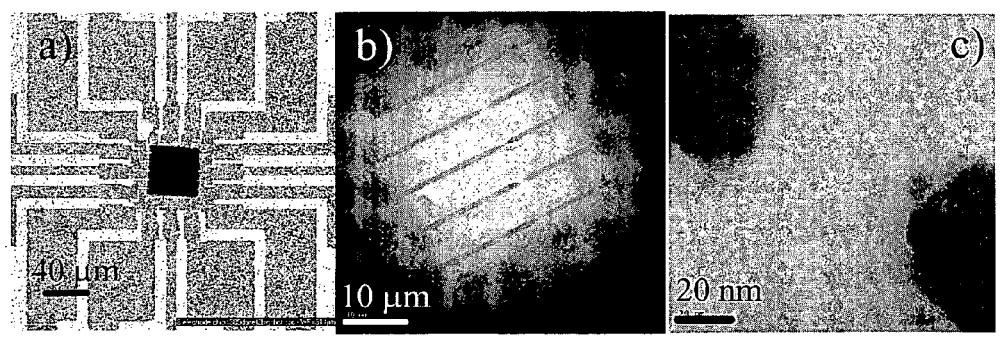
FIG. 19(*a*) is a scanning electron micrograph of an embodiment of a memory device of the present invention—scale bar is 40 microns.

Referring to FIG. 19, there are also provided memory devices and recordable media that can be fabricated without a gate. The devices shown in FIG. 19 have the same geometry as in FIG. 18, but they do not have a gate, i.e., they do not have the thin gold film on the back of the device. These devices can be made with electron-beam lithography on silicon nitride substrates. In FIG. 19(c) we show two gold electrodes separated by ~60 nm, corresponding to about 10-15 nanocrystals. FIG. 19 shows memory devices and recordable media fabricated on the silicon nitride (e.g., $Si_3N_4$) window. From left to right, with increasing magnification: SEM increasing magnification: SEM picture (the silicon nitride window appears black), TEM picture of the silicon nitride window with 5 pairs of electrodes, and close-up view of the electrodes with deposited NCs. From left to right: scale bars are 40 microns, 10 microns, and 20 nm.

Certain embodiments of the present invention include a nanocrystal memory element composed of a single NC, as illustrated in FIG. 5(b). In one embodiment, a single CdSe nanocrystal (NC) can be electrically attached to metal (e.g., gold) electrodes via conducting nanotubes (NT) (e.g., carbon nanotubes). FIG. 5 also depicts nanocrystal-nanotube circuitry: a) 1NC-1NT-1NC, b) NTs as 'leads' for contacting NCs, c) 1NC attached to multiple NTs.

Further details for attaching one nanocrystal to one or more carbon nanotubes are provided herein. One method can be based on the basic chemistry procedure by Ravindran et al. First, carbon nanotubes can be purified in nitric acid. Nitric acid also opens the carbon bonds along the NTs, while creating reactive carboxylic (e.g., COOH) groups. If the purification is performed over a long time period, the COOH groups can form at the ends of the NTs. These NT ends can react with NCs functionalized with amine groups. Therefore, the NCs can be functionalized with amine groups and attach them to the NTs.

Figure 21:
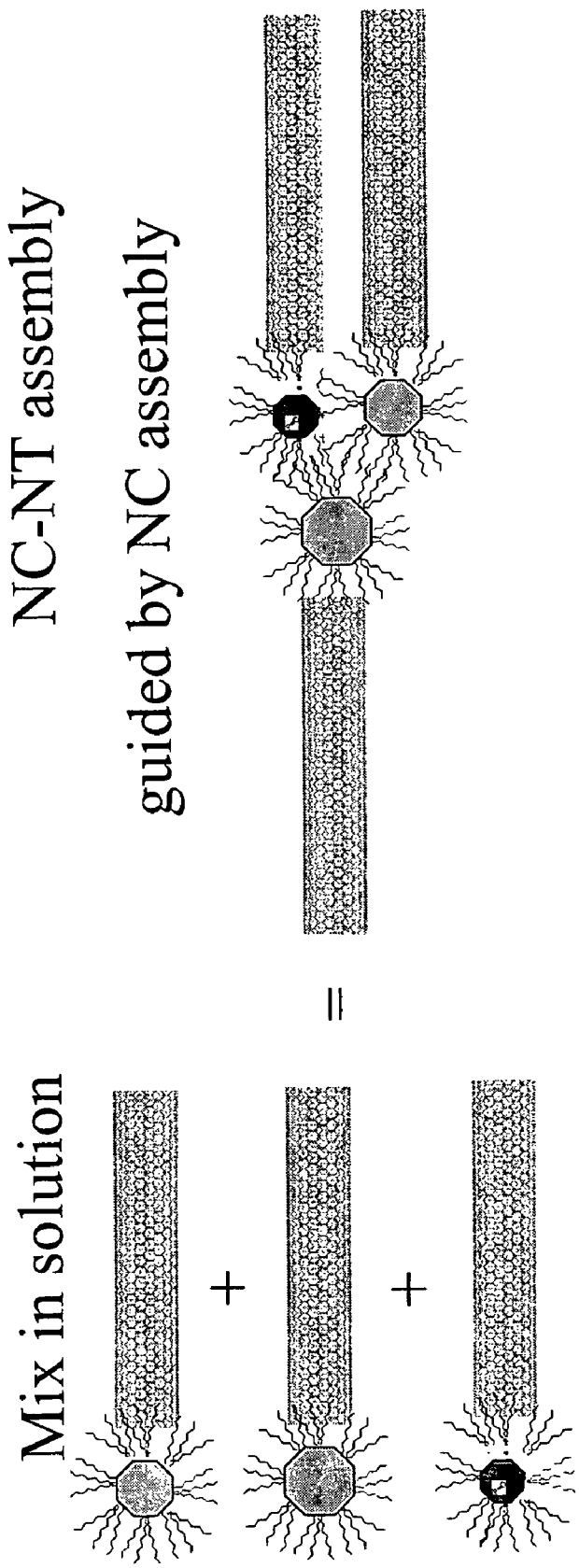
FIG. 21 illustrates a schematic diagram of memory elements of the present invention incorporating different sized NCs and NTs.

Certain embodiments also provide nanotubes that can then be used as 'nanoleads' to electrically contact one ore more nanocrystals. Nanoleads connected to NCs can be used to provide memory elements with heterogeneous nanocrystals (i.e., nanocrystals with different sizes and/or different materials). Referring to FIG. 21, green (CdSe ~2.8 nm diameter), red (CdSe ~5.5 nm diameter) and blue (CdSe/ZnS ~2 nm and smaller in diameter) nanocrystals can be first attached to nanotubes, and then the nanocrystals self-assemble into arrays and guide the assembly of nanotubes (e.g., nanoleads). In this way, memory elements can be provided with two or more nanocrystals of different sizes, different compositions, or both.

One embodiment also provides for nanocrystal-nanotube networks/circuitry. As provided further herein, nanotubes can be attached chemically. Nanotube ends can be opened to provide dangling bonds (i.e., break the carbon bonds at the ends, as the nanotube can be a closed object), and then use those dangling bonds to attach them to the nanocrystals. In these embodiments, nanocrystals can be capped with amine groups to attach to carboxylic groups on the opened carbon nanotubes. First, carbon nanotubes can be purified in nitric acid. Nitric acid also opens the carbon bonds along the NTs, while creating reactive carboxylic (COOH) groups. If the purification is performed over a long time period, the COOH groups can form at the ends of the NTs. These NT ends can react with NCs functionalized with amine groups. Therefore, we can functionalize the NCs with amine groups and attach them to the NTs.

Figure 22:
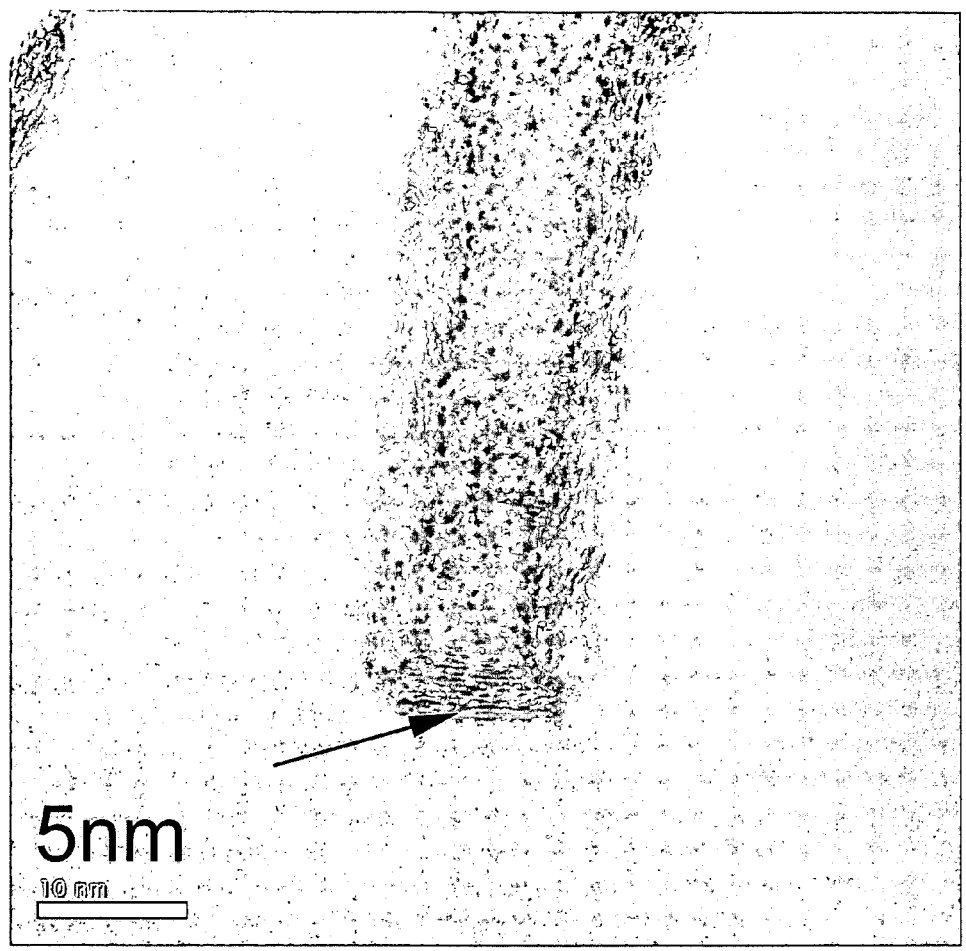
FIG. 22 is a transmission electron micrograph of one multi-walled carbon NT (MWCNT) in which the end is opened (indicated with an arrow); the NT diameter is about 8 nm.

If the nanotube purification is performed for a long time, then the NCs can attach to the NT sidewalls. While the NTs tend to sediment in solution, when the NTs are attached to the NCs, the NT-NC structures can float freely in solution, because the NCs can be soluble. Referring to FIG. 22, there is provided a transmission electron micrograph (TEM) of one multi-walled carbon NT (MWCNT). The NT end can be opened (indicated with the arrow) using a nitric acid treatment. The NT diameter can be ~8 nm.

Figure 20:
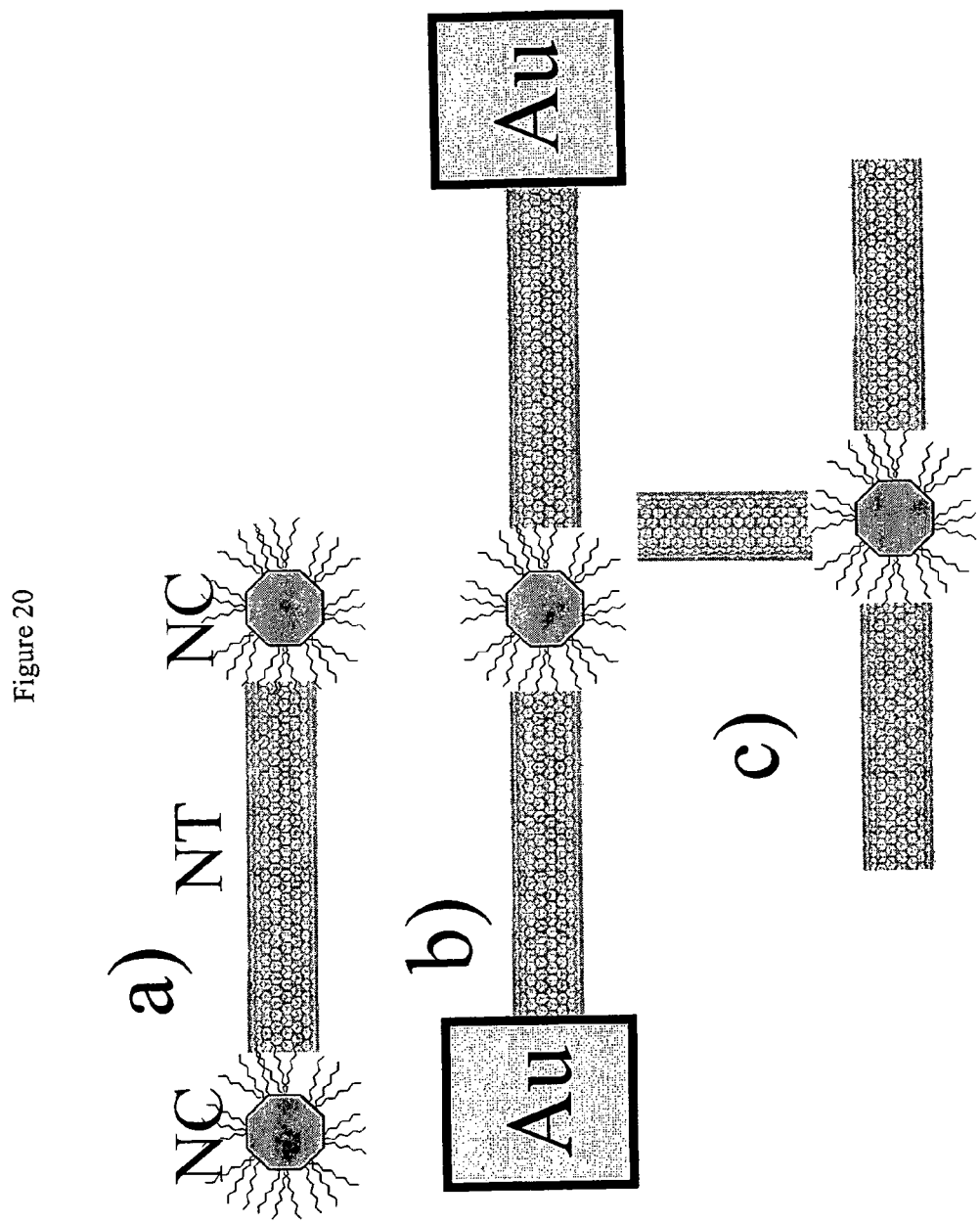
FIG. 20 illustrates a schematic diagram of nanocrystal-nanotube circuitry (NT nanotube) for use with various embodiments of the NC memory devices of the present invention: (a) 1 NC-1 NT-1 NC; (b) NTs as 'leads' for contacting NCs to electrodes; (c) 1 NC attached to multiple NTs.

Referring to FIG. 20, there is provided a schematic of three basic NC-NT geometries that we propose to realize. FIG. 20 (a) illustrates two NCs attached via a carbon nanotube. This system can be used to measure the charge transfer between the nanocrystals and the nanotube. This charge transfer might have signatures in the shift of the absorption and emission peaks of the NCs, as well as in their blinking properties. A fluorescence microscope can be used to measure how the NC luminescence and charge is affected by the carbon NTs.

A series of systematic measurements is also performed to investigate the charge transfer between the NCs and NTs in the NT-NC system as a function of the NC properties (e.g., CdSe and PbSe NC in a range of diameters) and NT properties (e.g., single, or multiple-walled NTs). If there is significant coupling between the NCs and NTs, we should observe the changes in the absorption and emission spectra of the composite structures compared to the NCs or NTs alone. NTs have distinct absorption and emission features in the infrared range and we can study how these spectra can be affected by the coupling with NCs. Future time-resolved optical measurements should be possible in collaboration with other PIs in the Physics Department at Penn.

Recently, Zhao et al. have theoretically investigated the coherent mesoscopic transport through the system with one NC in between two multi-walled carbon nanotubes. They provide useful calculations on how the tunneling current characteristics depend on the details of the level matching between the NTs and the NC 61.

FIG. 20 (b) illustrates another geometry that we propose to study. This can be a NT-NC-NT transistor formed by attaching two nanotubes to gold electrodes, with one NCs in between two NTs.

NTs can also be used as nanoscale electrical leads to contact the NCs. NTs can be useful to make electrical contacts to other nanoscale structures, and so this approach might have broad applications. For this application, we plan to use primarily the multi-walled carbon nanotubes which typically show the metallic behavior.

FIG. 20 (c) illustrates a geometry where one NC is attached to three nanotubes. Because the NC capping molecules can be uniformly distributed along the NCs surface, we expect to be able to attach multiple NTs to one NCs. This might be possible by precisely controlling the NC and NT concentration in solution. There are also other parameters such as temperature and presence of chemical additives that can be varied.

EXAMPLES AND OTHER ILLUSTRATIVE EMBODIMENTS

Figure 1B:
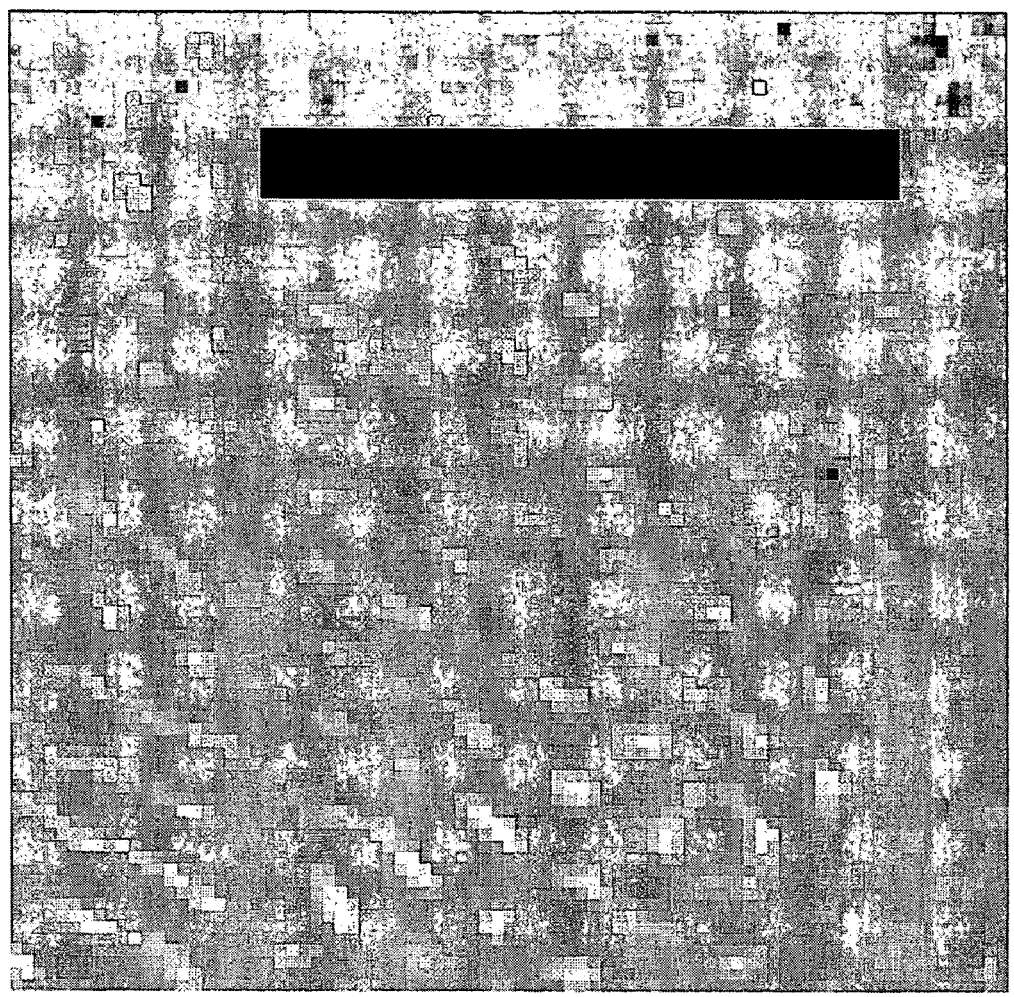

Nanocrystal ("NC") quantum dot memory devices and recordable media were fabricated using field-effect transistors (FETs) and organically-capped CdSe and CdSe/ZnS nanocrystals. Referring to FIG. 1(a), devices were prepared using monodisperse TOPO-capped NCs, 3 to 6 nm in diameter, with rms size dispersion <5%. NCs were either drop-casted or spin-coated onto the device from a highly concentrated hexane-octane solution and dried in vacuum. A TEM of the NC film is provided in FIG. 1(b). The NCs self-assemble between 1-mm long Au electrodes, separated by ~2 µm on top of a 300-nm thick silicon oxide and a conductive gate below the oxide. The NC film thickness was varied from a few to hundreds of NC layers.

Figure 1C:
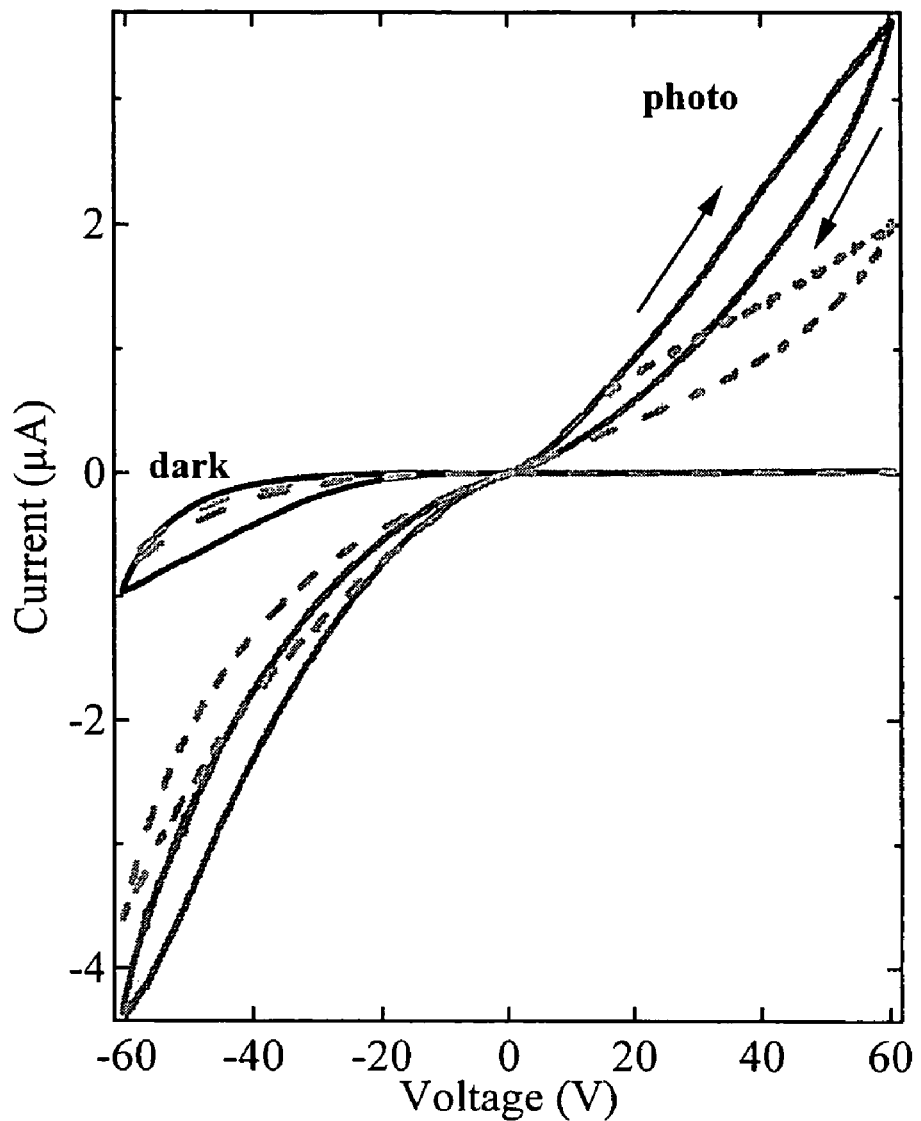

The measurement setup included a cryostat operated from 1.5 K to 800 K. Silver-soldered Teflon™-coated wires were used as electrical leads to the device and the sample stage was made from Cu and Macor. NCs were annealed in vacuum at ~600 K to 650K for one hour in situ and measured at 300 K and 77 K. Annealing in situ decreased the separation between the NCs and increased the conductivity to a magnitude comparable with that of n-doped CdSe NCs (see, e.g., Yu, D., et al, Phys. Rev. Lett. 92 (21), 216801, 2004). NCs were photoexcited with a 532 nm wavelength (green) diode laser operating at ~3 mW. FIG. 1(c) shows the current-voltage curves of a device with 5 nm CdSe NCs at 300 K and 77 K in the dark and during photoexcitation. Voltage was applied to the source electrode and current was measured at the drain electrode with a current amplifier; the gate was grounded. For this FET geometry, the photocurrent curve is nearly symmetric while the dark-current curve is highly asymmetric. Hysteresis was observed in both cases and is inversely proportional to the voltage sweep rate. The dark current was ~0 for V>0, while for V<0 electrons contributed to transport. A constant negative voltage generated a current transient in the NC array which decayed as a power law in time; specifically, $I(t)=I_0 t^a$ where $-1<a<0$.

Figure 2:
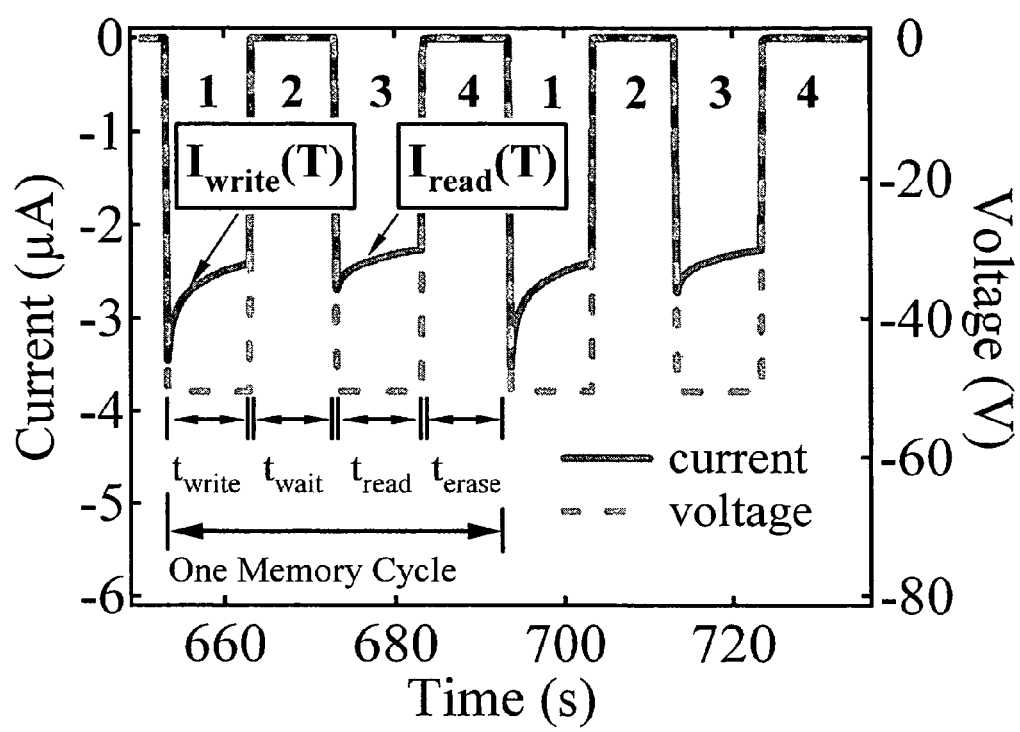
FIG. 2 depicts voltage (dashed line) and current (solid line) versus time for two consecutive memory cycles for the device in FIG. 1(c); the numbered steps are: 1) write (V<0, dark), 2) wait (V=0, dark), 3) read (V<0, dark), 4) erase (V=0, photoexcitation) OR (V>0, dark); in this embodiment, $t_{write} = t_{wait} = t_{read} = t_{erase} = 10$ s and V=−50 V during $t_{write}$ and $t_{read}$; in step 4, photoexcitation was induced with a 532 nm laser; $I_{write}(T)$ and $I_{read}(T)$ are current values at time T after the start of the write and read steps, respectively.

NC memory was probed with a four step voltage sequence as shown in FIG. 2. The four steps are labeled as, 1) write, 2) wait, 3) read and 4) erase to illustrate the potential for NC-based memory technology. The step durations are $t_{write}$, $t_{wait}$, $t_{read}$ and $t_{erase}$, respectively and the current transients during the write and read steps are $I_{write}(t)$ and $I_{read}(t)$, respectively; $I_{write}(T)$ and $I_{read}(T)$ are the currents at time T after the start of their corresponding voltage steps. This four step cycle is referred to as the memory cycle. The first three steps are the voltage pulses $-|V|$, 0, and $-|V|$. As shown in FIG. 2, these voltage pulses generate current transient sequences, $I_{write}(t)$, 0, and $I_{read}(t)$, respectively, where $|I_{read}(t)|<|I_{write}(t)|$. In the fourth step, either a positive voltage is applied or photoexcitation is induced with visible light at V=0. This fourth step is used to reset or erase the memory so that a subsequent application of $-|V|$ can generate $I_{write}(t)$ again. Memory cycles were measured for electric fields from 0 to $-30$ V/µm; $t_{write}$, $t_{wait}$, $t_{read}$ and $t_{erase}$ were each varied from 1 s to 1000 s. Measurements were performed for both positive voltage and visible light resetting. In all cases tested $|I_{read}(T)|<|I_{write}(T)|$. Memory was exhibited at both 300 K and 77 K for all voltages tested. The results depicted in FIG. 2 were obtained for 77 K and $E=-2.7\times 10^5$ V/cm across the device.

Figure 3A:
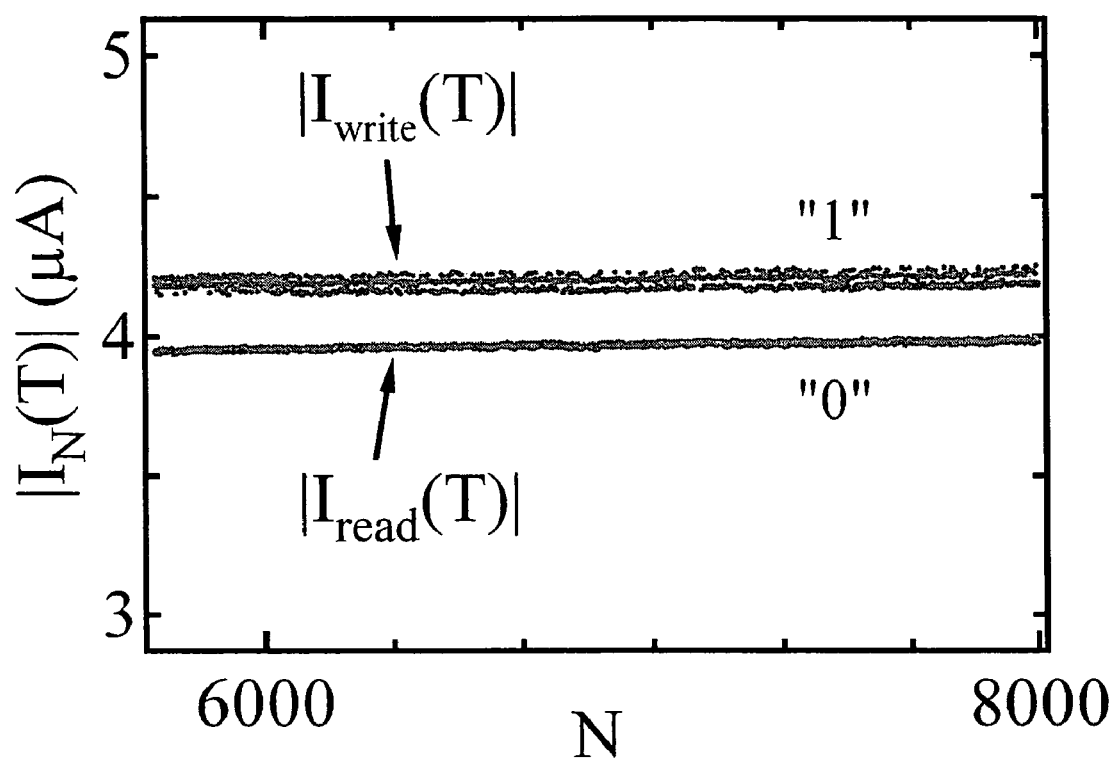
FIG. 3(a) depicts $|I_N(T)|$ versus the transient number, i.e., the number of the negative voltage steps, N, for 1000 consecutive memory cycles; $I_N(T)$ is the current value at time T after the application of the Nth negative voltage step. $I_{write}(T)$ and $I_{read}(T)$ correspond to even and odd values of N, respectively (see FIGS. 2(a)-(c)); $t_{write} = t_{read} = t_{erase} = 1$ S, $t_{wait} = 3.5$ s, T=500 ms, V=−50 V and photoexcitation was used to erase.
Figure 3:
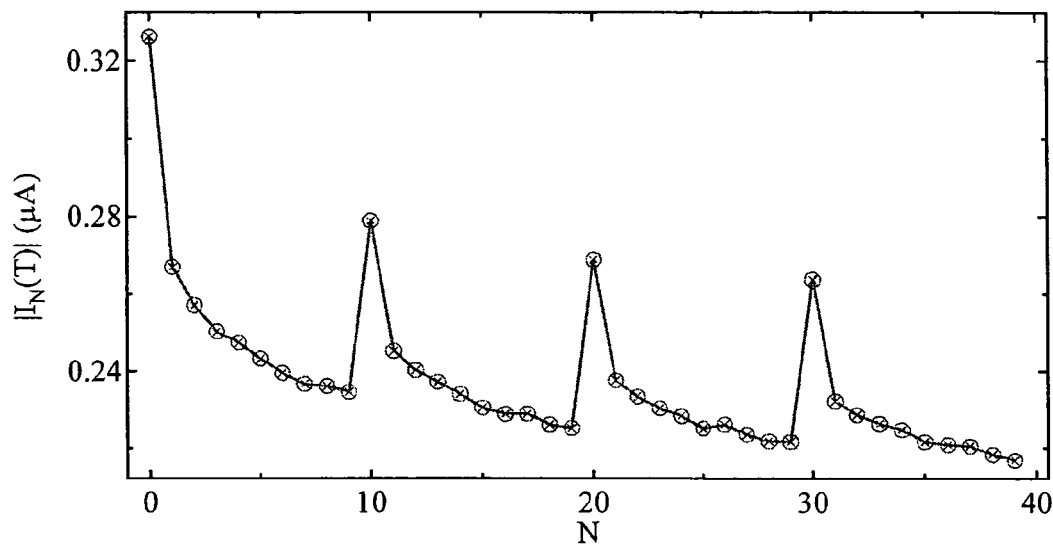
FIG. 3(b1) depicts $|I_N(T)|$ versus the transient number, N, for consecutive memory cycles modified to have nine read steps per cycle; $t_{write} = t_{wait} = t_{read} = t_{erase} = 100$ s, T=500 ms, V=−50 V and positive voltage was used to erase.
Figure 3:
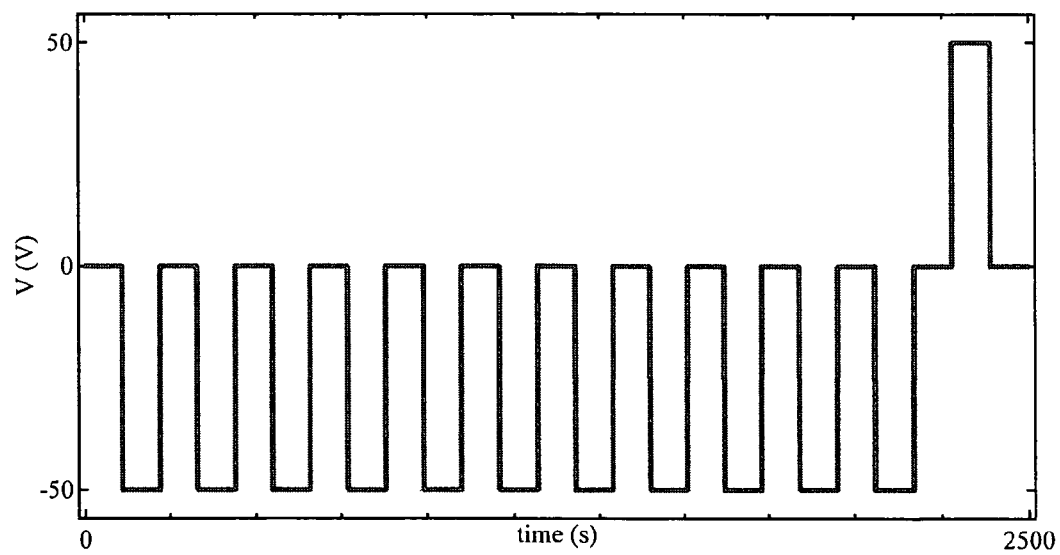

FIG. 3 (a) shows $|I_{write}(T)|$ and $|I_{read}(T)|$ for a thousand consecutive memory cycles from the device in FIG. 2. Here, T=500 ms, $t_{write}=1$ S, $t_{wait}=3.5$ S, $t_{read}=t_{erase}=1$ s and photoexcitation was used in the erase step. As shown, $|I_{read}(T)|<|I_{write}(T)|$ and both are nearly constant over thousands of iterations (~2 hrs). To illustrate the utility of CdSe NCs in memory applications, $I_{write}(T)$ and $I_{read}(T)$ can be defined as two states, "1" and "0", respectively. The difference $\Delta I(T)=|I_{write}(T)-I_{read}(T)|\sim 0.2$ µA can be sufficiently large to avoid overlap of "1"s and "0"s due to current fluctuations (~10 nA). $\Delta I(T)>0.1$ µA for all $t_{write}$, $t_{wait}$, $t_{read}$ and $t_{erase}$. The memory properties are robust. The device depicted in FIG. 1(a) was probed with thousands of voltage pulses over three months and no measurable degradation was observed.

Without being bound by a particular theory of operation, reversible switching of the current between "1" and "0" states in FIG. 3(a) can be explained by charge trapping in the NC array. During negative voltage pulses, electrons are injected into the array and some get trapped. Coulomb interactions between charges in CdSe NC arrays are unscreened and allow the trapped electrons to repel new electrons from entering the array, which reduces conduction. A positive voltage pulse removes trapped charges and therefore enhances conduction. This interpretation is supported by FIG. 3 (b1) which shows memory cycles modified such that $I_{read}(T)$ is measured nine times before the NCs are reset (e.g., by positive voltage, as depicted in FIG. 3(b2)). The number of trapped charges increases with each additional negative voltage pulse and each set of nine $I_{read}(T)$ values show monotonic decrease. In each cycle, the positive voltage used in the erase step removes most but not all of the trapped charges that accumulate during the single write step and the nine read steps. The currents in the subsequent cycles are therefore lower (FIG. 3 (b)). Even without the positive voltage step, trapped charges are able to diffuse out of the NC array during the wait step, when V=0 across the array. As $t_{wait}$ increases, the number of charges which escape during this step increases. This is reflected in the upper curve (triangles) in FIG. 3 (c) showing the average ratio $<I_{read}(T)/I_{write}(T)>$ plotted against $t_{wait}$. As expected, $<I_{read}(T)/I_{write}(T)>$ increases as $t_{wait}$ increases. As $t_{wait}$ approaches infinity, all of the trapped charges diffuse out of the array and $<I_{read}(T)/I_{write}(T)>$ approaches unity.

Figure 3C:
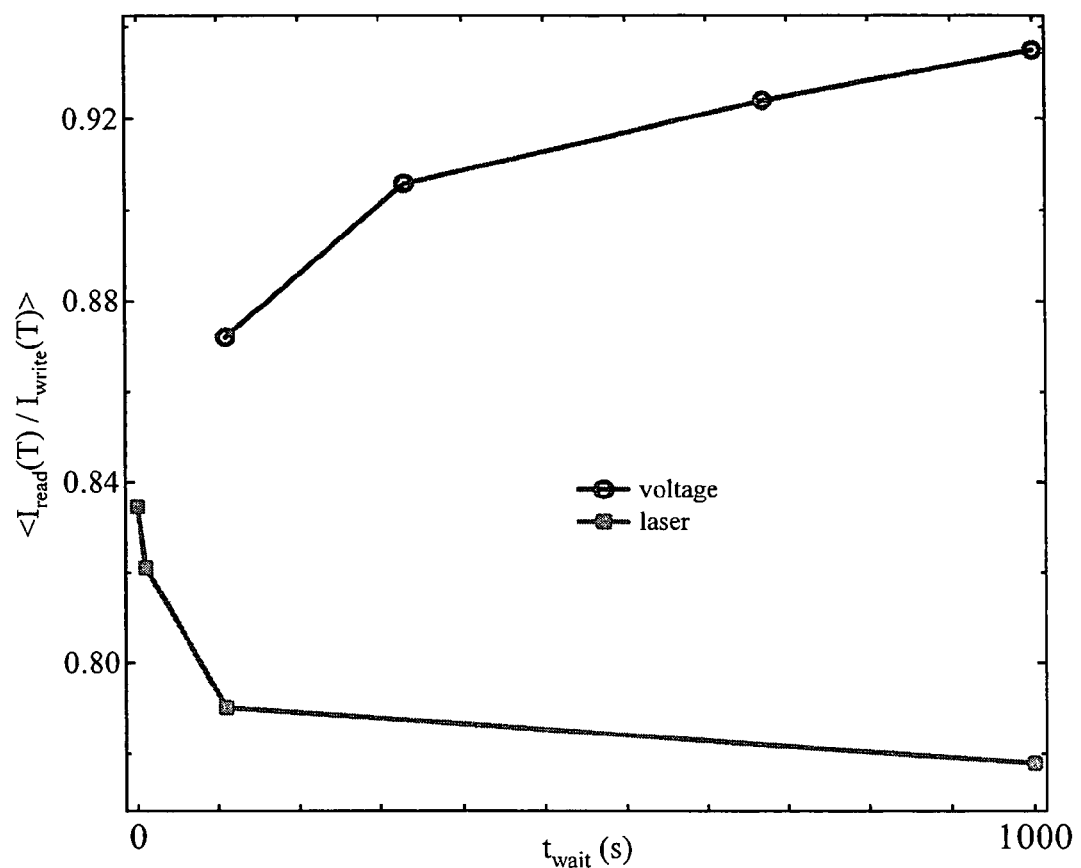
FIG. 3(c) depicts the average value $<I_{read}(T)/I_{write}(T)>$, calculated over consecutive iterations, versus $t_{wait}$ for positive voltage erasing (circles) and photoexcitation (laser) erasing (squares)

The lower curve in FIG. 3(c) shows $<I_{read}(T)/I_{write}(T)>$ vs. $t_{wait}$ when photoexcitation at V=0 is used as the erase step. As shown, $<I_{read}(T)/I_{write}(T)>$ decreases as a function of $t_{wait}$, which is opposite to the behavior for positive voltage erasing. It was shown in FIG. 1 that the photocurrent is significantly larger than the dark current. Photoconductivity has previously been shown to persist in thin films of CdSe NCs for up to $10^4$ S after exposure to light by Ginger et al. Without being bound by a particular theory of operation, this mechanism of persistent photoconductivity explains the lower curve in FIG. 3(c). Persistent photoconductivity is at its maximum immediately after the photoexcitation erase step ends, and then decays. $I_{read}(T)$ is measured at a time $T=t_{write}+t_{wait}+T$ after the erase step ends. As $\tau$ increases, the persistent photoconductivity decreases and $|I_{read}(T)|$ decreases. The lower curve in FIG. 3(c) can therefore be interpreted as a measurement of the decay of persistent photoconductivity.

Figure 4:
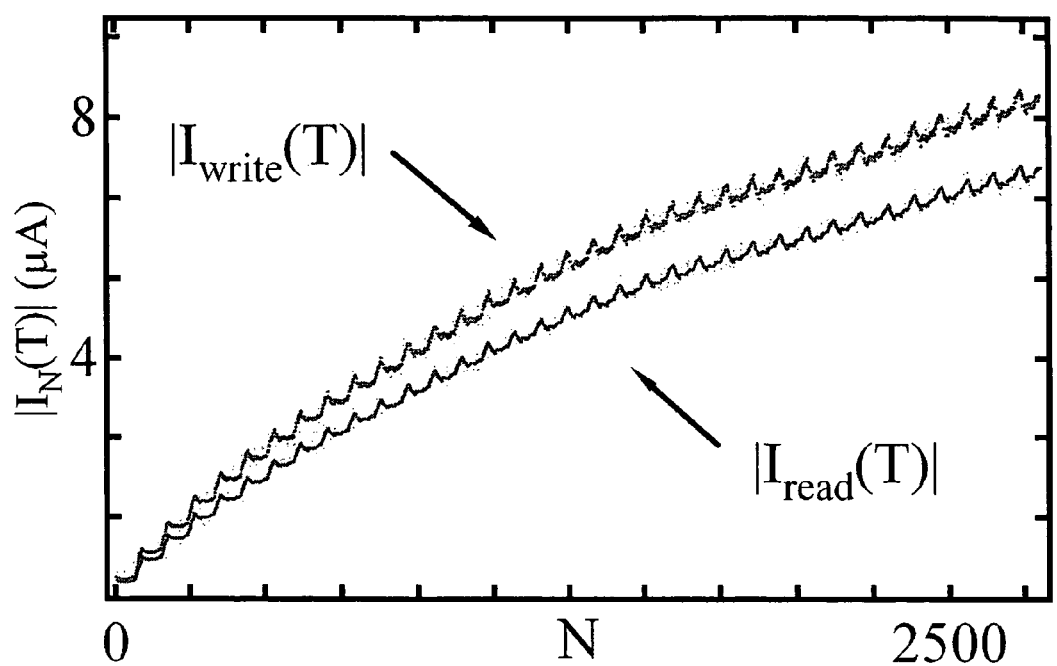
FIG. 4(a) depicts $|I_N(T)|$, the current value at time T after the application of the $N^{th}$ negative voltage step, versus the transient number, N, for consecutive memory cycles with laser resetting (FIG. 2); $t_{erase}$ changes every ten cycles from $t_{erase}=1$ s (triangles), to 10 s (squares), 100 s (circles) and 1000 s (diamonds); after ten $t_{erase}=1000$ s memory cycles, $t_{erase}$ is set back to 1 s and the entire 40-step sequence is repeated; $t_{write} = t_{wait} = 10$ s, T=500 ms and V=−50 V; the first 3 repetitions of these 40-step sequences are shown. $I_{write}(T)$ and $I_{read}(T)$ correspond to even and odd values of N, respectively (see FIG. 2)
FIG. 4(b) depicts $|I_N(T)|$ versus the transient number, N, for 35 repetitions of 40-step sequences (~120 hrs)

When photoexcitation is used to erase NC memory, the effect of persistent photoconductivity can be used to "tune" the NC array's response to the write and read steps. If many memory cycles are measured consecutively, increasing (decreasing) $t_{erase}$, i.e., the duration of photoexcitation at V=0, can increase (decrease) $|I_{write}(T)|$ and $|I_{read}(T)|$ with each iteration of the memory cycle. To demonstrate this effect, $t_{write}$ and $t_{wait}$ were held constant while $t_{erase}$ (by photoexcitation) was varied. First, $t_{erase}$ was set to 1 s and then increased by one order of magnitude after every ten memory cycles, up to $t_{erase}=1000$ S. After ten $t_{erase}=1000$ s cycles, $t_{erase}$ was set back to 1 s and the entire 40-step sequence was repeated. Three consecutive 40-step sequences are shown in FIG. 4 for $t_{write}=t_{read}=t_{wait}=10$ s. As shown, the slopes of the two lines, $|I_{write}(T)|$ and $|I_{read}(T)|$, change periodically with each repetition of the 40-step sequence. The slopes are negative for $t_{erase}=1$ s (i.e., $t_{erase}/t_{write}<1$), nearly zero for $t_{erase}=10$ s ($t_{erase}/t_{write}=1$) and positive for both $t_{erase}=100$ s and $t_{erase}=1000$ S ($t_{erase}/t_{write}>1$). The increase (decrease) of the slopes as $t_{erase}/t_{write}$ increases (decreases) was observed for all parameters. The slopes and the ratio $t_{erase}/t_{write}$ for which the slopes change sign, depend on $t_{wait}$ and the laser power. As shown in FIG. 4, the current increase for $t_{erase}=1000$ s is greater than the current decrease for $t_{erase}=1$ s and there is, therefore, a net increase of the current. After ~120 hrs of repeating these 40-step cycles, the current was increased by nearly an order of magnitude.

These examples show that colloidal CdSe NCs exhibit robust memory effects that can be exploited for memory applications. NC memory can be erased electrically or optically and is re-writable. CdSe NC memory devices can be scaled down. For example, for a 100 nm gap, the voltage required to obtain similar currents can be ~5V.

What is claimed:

1. A memory device, comprising
an electrically conductive film composed of one or more nanocrystals, the electrically conductive film situated in electrical communication with a source electrode and a drain electrode, and a voltage source for inducing and detecting a memory effect in said electrically conductive film,
wherein the electrically conductive film, source electrode and drain electrode are situated adjacent to a first insulating layer or substrate, and
the device further comprising a second insulating layer disposed on top of the electrically conductive film;
wherein the second insulating layer comprises silicon oxide, silicon nitride, silicon oxynitride, polyimide, PCTE, PTFE, or PMMA.

2. The memory device of claim 1, wherein the nanocrystals are semiconducting.

3. The memory device of claim 2, wherein the electrically conductive film is composed of one or more CdSe, CdSe/ZnS, CdTe, or Si nanocrystals, or any combination thereof.

4. The memory device of claim 3, wherein the nanocrystals are CdSe or CdSe/ZnS.

5. The memory device of claim 4, wherein the CdSe/ZnS nanocrystals comprise a CdSe core of about 3 to about 8 nm thick, a ZnS shell about 1 to 2 nm thick, and ligand molecules attached to the nanocrystals.

6. The memory device of claim 1, wherein the nanocrystals comprise one or more ligand molecules bonded to the nanocrystal.

7. The memory device of claim 6, wherein the ligand molecules comprise phosphines, pyridines, oleic acid, thiols, alkanes, amines, carboxylic acids, pyrazines, or any combination thereof.

8. The memory device of claim 7, wherein the phosphines comprise tri-octyl phosphine oxide, tri-butylphosphine oxide, or any combination thereof.

9. The memory device of claim 1, further comprising a gate.

10. The memory device of claim 9, wherein the gate is disposed adjacent to the insulating layer or substrate opposite to the electrically conductive film, source electrode and drain electrode.

11. The memory device of claim 10, wherein the gate is metal or n-doped silicon.

12. The memory device of claim 1, wherein the electrically conductive film is composed of red and blue nanocrystals.

13. A memory device composed of a plurality of memory devices of claim 1.

14. A method of operating a memory device, comprising:
applying a first non-zero voltage pulse to alter the electrical properties of an electrically conductive film composed of nanocrystals during a first time period, the electrically conductive film being in electrical contact with a source electrode and a drain electrode, and
applying a second voltage pulse to the electrically conductive film during a second time period, and
correlating an electrical property of said electrically conductive film in response to the second voltage pulse to ascertain whether the electrically conductive film was altered by the first voltage pulse;
wherein the first voltage pulse is a write step and the second voltage pulse is a read step; and
wherein a range of different write steps are performed and current transients generated by the read steps are characterized as a function of waiting time between the first and second voltage pulses.

15. The method of claim 14, wherein the effect of the write step on the electrically conductive film is erased by shining band gap light on the nanocrystals, by applying a positive voltage bias, or any combination thereof.

16. The method of claim 15, wherein the electrically conductive material is subject to one or more write-read-erase cycles.

17. The method of claim 15, wherein the electrically conductive film is composed of red and blue nanocrystals, and the red nanocrystals in the film are selectively erased using green light.

18. The method of claim 14, wherein the method is at least partially operated at one or more temperatures in the range of from 77K to 600 K.

19. The method of claim 18, wherein the method is at least partially operated at one or more temperatures in the range of from 77K to 373 K.

20. A recordable media, comprising
an electrically conductive film composed of one or more nanocrystals, the electrically conductive film situated in electrical communication with a source electrode and a drain electrode,
wherein the electrically conductive film, source electrode and drain electrode are situated adjacent to an insulating layer or substrate, and
the recordable media further comprising a second insulating layer disposed on top of the nanocrystal layer;
wherein the second insulating layer comprises silicon oxide, silicon nitride, silicon oxynitride, polyimide, PCTE, PTFE, or PMMA.

21. The recordable media of claim 20, wherein the nanocrystals are semiconducting.

22. The recordable media of claim 21, wherein the electrically conductive film is composed of one or more CdSe, CdSe/ZnS, CdTe, or Si nanocrystals, or any combination thereof.

23. The recordable media of claim 22, wherein the nanocrystals are CdSe or CdSe/ZnS.

24. The recordable media of claim 23, wherein the CdSe/ZnS nanocrystal comprises a CdSe core of about 3 to about 8 nm thick, a ZnS shell of about 1 to 2 nm 1-2 nm thick, and a ligand attached to the nanocrystal surface.

25. The recordable media of claim 20, wherein the nanocrystals comprise one or more ligand molecules bonded to the nanocrystal.

26. The recordable media of claim 25, wherein the ligand molecules comprise phosphines, pyridines, oleic acid, thiols, alkanes, amines, carboxylic acids, pyrazines, or any combination thereof.

27. The recordable media of claim 26, wherein the phosphines comprise tri-octyl phosphine oxide, tri-butylphosphine oxide, or any combination thereof.

28. The recordable media of claim 20, further comprising a gate.

29. The recordable media of claim 28, wherein the gate is disposed adjacent to the insulating layer or substrate opposite to the electrically conductive film, source electrode and drain electrode.

30. The recordable media of claim 29, wherein the gate is metal or n-doped silicon.

31. The recordable media of claim 20, wherein the electrically conductive film is composed of red and blue nanocrystals.

32. A method of writing one or more data bits on a recordable media, comprising:
applying a first voltage pulse to alter the electrical properties of an electrically conductive film composed of nanocrystals situated adjacent to a first insulating layer or substrate, and a second insulating layer disposed on top of the electrically conductive film, during a first time period, the electrically conductive film being in electrical contact with a source electrode and a drain electrode;
wherein the second insulating layer comprises silicon oxide, silicon nitride, silicon oxynitride, polyimide, PCTE, PTFE, or PMMA.

33. A method of reading one or more data bits written on a recordable media in which a first non-zero voltage pulse may have been applied to alter the electrical properties of an electrically conductive film composed of nanocrystals during a first time period, the electrically conductive film being in electrical contact with a source electrode and a drain electrode, the method comprising:
applying a second non-zero voltage pulse to the electrically conductive film during a second time period, and
correlating an electrical property of said electrically conductive film in response to the second voltage pulse to ascertain whether the electrically conductive film was altered by the first voltage pulse;
wherein a range of different write steps are performed and current transients generated by read steps are characterized as a function of waiting time between the first and second voltage pulses.

34. The method of claim 33, further comprising erasing the write step on the electrically conductive film by shining band gap light on the nanocrystals, by applying a positive voltage bias, or any combination thereof.

35. The method of claim 34, wherein the electrically conductive material is subject to one or more write-read-erase cycles.

36. The method of claim 34, wherein the electrically conductive film is composed of red and blue nanocrystals, and the red nanocrystals in the film are selectively erased using green light.

37. The method of claim 33, wherein the method is at least partially operated at one or more temperatures in the range of from 77K to 600 K.

38. The method of claim 37, wherein the method is at least partially operated at one or more temperatures in the range of from 77K to 373 K.

39. A memory device, comprising
an electrically conductive film composed of a plurality of populations of nanocrystals, at least two of the nanocrystals having different cross-sectional dimensions,
the electrically conductive film being situated in electrical communication with a source electrode and a drain electrode, and
a voltage source capable of inducing and detecting a memory effect in said electrically conductive film.

40. A memory device, comprising
an electrically conductive film composed of one or more nanocrystals, at least one nanocrystal in electrical communication with a nanotube,
the electrically conductive film situated in electrical communication with a source electrode and a drain electrode, and
a voltage source capable of inducing and detecting a memory effect in said electrically conductive film; and
a second insulating layer disposed on top of the electrically conductive film;
wherein the second insulating layer comprises silicon oxide, silicon nitride, silicon oxynitride, polyimide, PCTE, PTFE, or PMMA.

41. A memory device, comprising
an electrically conductive film composed of one or more nanocrystals,
the electrically conductive film including at least one red nanocrystal, at least one blue nanocrystal, or at least one red and at least one blue nanocrystal,
the electrically conductive film situated in electrical communication with a source electrode and a drain electrode, and a voltage source for inducing and detecting a memory effect in said electrically conductive film,
wherein the electrically conductive film, source electrode and drain electrode are situated adjacent to a first insulating layer or substrate, and
a second insulating layer disposed on top of the electrically conductive film.

42. A method of operating a memory device, comprising:
applying a first voltage pulse to alter the electrical properties of an electrically conductive film composed of nanocrystals during a first time period,
the electrically conductive film being composed of red and blue nanocrystals, and the red nanocrystals in the film are selectively erased using green light,
the first voltage pulse being a write step, the effect of the write step on the electrically conductive film being erased by shining band gap light on the nanocrystals, by applying a positive voltage bias, or any combination thereof,
the electrically conductive film being in electrical contact with a source electrode and a drain electrode;
applying a second voltage pulse to the electrically conductive film during a second time period,
the second voltage step being a read step; and
correlating an electrical property of said electrically conductive film in response to the second voltage pulse to ascertain whether the electrically conductive film was altered by the first voltage pulse.

43. A recordable media, comprising
an electrically conductive film composed of one or more nanocrystals, the electrically conductive film situated in electrical communication with a source electrode and a drain electrode,
wherein the electrically conductive film, source electrode and drain electrode are situated adjacent to an insulating layer or substrate,
the electrically conductive film being composed of red and blue nanocrystals,
the recordable media further comprising a second insulating layer disposed on top of the nanocrystal layer.

44. A method of reading one or more data bits written on a recordable media in which a first voltage pulse may have been applied to alter the electrical properties of an electrically conductive film composed of nanocrystals during a first time period, the electrically conductive film being composed of red and blue nanocrystals, and the red nanocrystals in the film are selectively erased using green light, the electrically conductive film being in electrical contact with a source electrode and a drain electrode, the method comprising:

applying a second voltage pulse to the electrically conductive film during a second time period;

correlating an electrical property of said electrically conductive film in response to the second voltage pulse to ascertain whether the electrically conductive film was altered by the first voltage pulse; and erasing the write step on the electrically conductive film by shining band gap light on the nanocrystals, by applying a positive voltage bias, or any combination thereof.

* * * * *